(12) United States Patent
Kirby et al.

(10) Patent No.: US 7,358,751 B2
(45) Date of Patent: *Apr. 15, 2008

(54) CONTACT PIN ASSEMBLY AND CONTACTOR CARD

(75) Inventors: Kyle K. Kirby, Boise, ID (US);
Warren M. Farnworth, Nampa, ID (US); James M. Wark, Boise, ID (US);
William M. Hiatt, Eagle, ID (US);
David R. Hembree, Boise, ID (US);
Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/152,513

(22) Filed: Jun. 14, 2005

(65) Prior Publication Data

US 2005/0275084 A1     Dec. 15, 2005

Related U.S. Application Data

(62) Division of application No. 10/791,195, filed on Mar. 2, 2004, now Pat. No. 7,282,932.

(51) Int. Cl.
*G01R 31/02* (2006.01)

(52) U.S. Cl. ........................... 324/754; 324/761
(58) Field of Classification Search ........ 324/754–762, 324/763, 765; 439/66–72; 438/14–17; 29/846, 842
See application file for complete search history.

(56) References Cited

U.S. PATENT DOCUMENTS

| | | | |
|---|---|---|---|
| RE27,089 E | 3/1971 | Sear et al. | |
| 4,118,090 A | 10/1978 | Del Mei | |
| 4,295,700 A | 10/1981 | Sado | |
| 4,297,312 A | 10/1981 | Carroll et al. | |
| 4,876,042 A | 10/1989 | Imataki et al. | |
| 4,916,002 A | 4/1990 | Carver | |
| 4,949,455 A | 8/1990 | Nakamura et al. | |
| 4,968,585 A | 11/1990 | Albrecht et al. | |
| 5,101,553 A | 4/1992 | Carey | |
| 5,317,255 A | 5/1994 | Suyama et al. | |
| 5,338,178 A | 8/1994 | Kato et al. | |
| 5,345,365 A | 9/1994 | Herndon et al. | |
| 5,399,982 A | 3/1995 | Driller et al. | |
| 5,418,471 A | 5/1995 | Kardos | |
| 5,475,318 A | 12/1995 | Marcus et al. | |
| 5,478,779 A | 12/1995 | Akram | |
| 5,483,741 A * | 1/1996 | Akram et al. | 29/846 |
| 5,484,964 A | 1/1996 | Dawson et al. | |

(Continued)

*Primary Examiner*—Vinh P. Nguyen
(74) *Attorney, Agent, or Firm*—TraskBritt

(57) ABSTRACT

A compliant contact pin assembly and a contactor card system are provided. The compliant contact pin assembly includes a contact pin formed from a portion of a substrate with the contact pin compliantly held suspended within the substrate by a compliant coupling structure. The suspension within the substrate results in a compliant deflection orthogonal to the plane of the substrate. The contact pin assembly is formed by generally thinning the substrate around the contact pin location and then specifically thinning the substrate immediately around the contact pin location for forming a void. The contact pin is compliantly coupled, in one embodiment by compliant coupling material, and in another embodiment by compliantly flexible portions of the substrate.

17 Claims, 21 Drawing Sheets

U.S. PATENT DOCUMENTS

| | | | |
|---|---|---|---|
| 5,625,298 A | 4/1997 | Hirano et al. | |
| 5,686,317 A | 11/1997 | Akram et al. | |
| 5,759,047 A | 6/1998 | Brodsky et al. | |
| 5,789,140 A | 8/1998 | Chou et al. | |
| 5,795,162 A | 8/1998 | Lambert | |
| 5,820,014 A | 10/1998 | Dozier, II et al. | |
| 5,821,763 A * | 10/1998 | Beaman et al. | 324/754 |
| 5,834,945 A | 11/1998 | Akram et al. | |
| 5,860,818 A | 1/1999 | Sakaki et al. | |
| 5,915,977 A | 6/1999 | Hembree et al. | |
| 5,926,029 A * | 7/1999 | Ference et al. | 324/762 |
| 5,926,375 A | 7/1999 | Watanabe et al. | |
| 5,939,817 A | 8/1999 | Takado | |
| 5,977,783 A | 11/1999 | Sakaki et al. | |
| 5,994,152 A | 11/1999 | Khandros et al. | |
| 6,016,060 A * | 1/2000 | Akram et al. | 324/757 |
| 6,025,731 A | 2/2000 | Hembree et al. | |
| 6,033,935 A | 3/2000 | Dozier, II et al. | |
| 6,049,976 A | 4/2000 | Khandros | |
| 6,059,982 A | 5/2000 | Palagonia et al. | |
| 6,078,186 A | 6/2000 | Hembree et al. | |
| 6,107,109 A | 8/2000 | Akram et al. | |
| 6,114,240 A | 9/2000 | Akram et al. | |
| 6,210,173 B1 | 4/2001 | Matsunaga | |
| 6,232,143 B1 | 5/2001 | Maddix et al. | |
| 6,242,803 B1 | 6/2001 | Khandros et al. | |
| 6,246,245 B1 | 6/2001 | Akram et al. | |
| 6,255,126 B1 | 7/2001 | Mathieu et al. | |
| 6,285,201 B1 | 9/2001 | Farnworth et al. | |
| 6,294,837 B1 | 9/2001 | Akram et al. | |
| 6,300,780 B1 | 10/2001 | Beaman et al. | |
| 6,356,098 B1 * | 3/2002 | Akram et al. | 324/765 |
| 6,426,638 B1 | 7/2002 | Di Stefano | |
| 6,462,575 B1 | 10/2002 | Cram | |
| 6,475,822 B2 | 11/2002 | Eldridge et al. | |
| 6,491,968 B1 | 12/2002 | Mathieu et al. | |
| 6,520,778 B1 | 2/2003 | Eldridge et al. | |
| 6,525,555 B1 | 2/2003 | Khandros et al. | |
| 6,556,030 B1 | 4/2003 | Akram | |
| 6,630,839 B1 | 10/2003 | Haseyama et al. | |
| 6,705,876 B2 * | 3/2004 | Eldridge | 439/66 |
| 6,741,085 B1 * | 5/2004 | Khandros et al. | 324/754 |
| 6,767,219 B2 | 7/2004 | Maruyama et al. | |
| 6,768,331 B2 | 7/2004 | Longson et al. | |
| 6,814,584 B2 | 11/2004 | Zaderej | |
| 6,830,460 B1 * | 12/2004 | Rathburn | 439/66 |
| 6,831,472 B2 | 12/2004 | Akram | |
| 6,844,241 B2 | 1/2005 | Halahan et al. | |
| 6,871,307 B2 | 3/2005 | Nachumovsky | |
| 6,897,666 B2 | 5/2005 | Swettlen et al. | |
| 6,953,348 B2 | 10/2005 | Yanagisawa et al. | |
| 6,965,158 B2 | 11/2005 | Smith et al. | |
| 7,114,960 B2 | 10/2006 | Rathburn | |
| 7,167,010 B2 | 1/2007 | Hembree | |
| 2001/0020545 A1 | 9/2001 | Eldridge et al. | |
| 2002/0027022 A1 | 3/2002 | Moriizumi | |
| 2002/0127893 A1 | 9/2002 | Brodsky | |
| 2004/0246010 A1 | 12/2004 | Di Stefano | |
| 2005/0017750 A1 | 1/2005 | Khandros et al. | |
| 2005/0101037 A1 | 5/2005 | Farnworth et al. | |

* cited by examiner

CONTACT PIN ASSEMBLY AND CONTACTOR CARD

CROSS-REFERENCE TO RELATED APPLICATION

This application is a divisional of application Ser. No. 10/791,195, filed Mar. 2, 2004, now U.S. Pat. No. 7,282,932, issued Oct. 16, 2007.

BACKGROUND OF THE INVENTION

1. Field of the Invention

The present invention relates to semiconductor devices and circuits and, more particularly, to compliant contact pins and methods of fabrication for connecting electrical signals to integrated circuits.

2. State of the Art

Semiconductor devices, from microprocessors to memory chips, are fabricated by performing a long series of processes and steps including etching, masking, depositing, and the like, on a semiconductor wafer or other bulk semiconductor substrate. Many integrated circuits may be fabricated on a single semiconductor wafer by placing them in arrays across the wafer. Ultimately, the individual circuits are singulated from the wafer and are either further processed, including packaging and additional testing, or discarded when they are determined to be undesirable.

Due to processing or other defects in the semiconductor wafer, certain ones of the integrated circuits may not function as designed. Such defects may be detected initially or may not become apparent until the integrated circuit has been in operation for a period of time. Therefore, it is important to test and electrically stress the integrated circuits to determine which circuits are operational and which ones are defective or are likely to become defective.

Semiconductor integrated circuits are typically subjected to a series of test procedures during the manufacturing process in order to verify functionality and reliability. Typical test approaches include wafer probe testing in which integrated circuits are individually tested to determine the operational characteristic of each before singulation from the semiconductor wafer.

Conventionally following initial testing, the integrated circuits are singulated into individual integrated circuit chips with the operational chips being further assembled into packages. The packaged devices are then "burned-in" by loading the packaged devices into sockets on burn-in boards and electrically operating the packaged devices at elevated temperatures for an extended testing period. Such elevated temperatures induce failure in marginally operative or non-operative devices, which allows such devices to be screened-out and discarded before they are integrated into higher level assemblies or sold. Burning-in and testing of packaged devices are typically accomplished through the use of sockets suited for the burn-in conditions and high speed testing. Accordingly, conventional manufacturing and testing processes are expensive and time consuming because of the repeated handling and testing of individual devices; therefore, individually tested and handled devices that ultimately fail have wasted costly resources and time.

A considerable advantage in cost and in process time could be attained by burning-in and testing a semiconductor wafer before it is singulated into discrete devices. Additional savings may be recognized by forgoing packaging of devices that ultimately fail once subjected to burn-in conditions. A considerable effort has been expended to develop effective methods for wafer level testing. One such approach utilizes cantilevered or spring-wire probes that are arranged on a contact or probe card for simultaneous contact to all of the devices on the semiconductor wafer. Such contactor cards are expensive to manufacture and result in undesirable electrical characteristics such as increased inductance along parallel wires.

Therefore, there is a need for providing a contact methodology that results in a highly economically manufacturable method of contacting individual semiconductor devices in a wafer-level testing environment.

Furthermore, individual dice generally need to be packaged into a higher assembly before they may be integrated into a system environment. These higher assemblies or packages generally need to accommodate or compensate for differences in thermal expansion between the individual die and the system level substrate. Therefore, there is a need for providing a contact methodology that mediates stresses between dissimilar materials.

BRIEF SUMMARY OF THE INVENTION

A compliant contact pin assembly, card, and methods associated therewith, are provided in various embodiments. In one embodiment of the present invention, a contact pin assembly includes a contact pin formed in place from a portion of a substrate. The contact pin is compliantly held suspended within the substrate by a compliant coupling structure. The suspension within the substrate results in a compliant deflection orthogonal to the plane of the substrate.

In another embodiment of the present invention, a method for forming a contact pin assembly is provided. A location for the contact pin is defined on a substrate in a location that corresponds to a target contact pad on, for example, a wafer to be tested. The substrate around the location is thinned for approximately the length of travel of the contact pin on the side defined as the contact end side. The substrate is locally thinned to a depth of at least the length of the contact pin immediately around the location of the contact pin to form a void surrounding the contact pin. The void is filled with compliant coupling material and the opposite side of the substrate is thinned to release the contact pin from the remaining substrate.

In another embodiment of the present invention, a method for forming a contact pin assembly wherein the substrate provides the compliant action for the contact pin is provided. The location for the contact pin is defined on the substrate and the substrate is thinned around the location. Further thinning around the contact pin forms a void. The opposite side of the substrate is thinned, but not all the way through to the void. Instead, the remaining substrate on the opposite side flexes when the contact end of the contact pin encounters and presses against a pad on a wafer or other device-under-test.

In yet a further embodiment of the present invention, a device assembly for coupling with a device to form an assembly for coupling with a substrate having a contact pad thereon includes a contact pin assembly and a device attached thereto.

In yet another embodiment of the present invention, a contactor card for interfacing between a tester and a device-under-test is provided. The contactor card includes a substrate configured for attachment with a semiconductor tester. The substrate further includes at least one contact pin assembly aligned for compliantly coupling with a device-under-test, such as a wafer. In a further embodiment, a method for making a contactor card is provided. The method forms at least one contact pin assembly on the substrate of the contactor card.

In yet a further embodiment, a method of testing a semiconductor wafer is provided. The method aligns the contact pads on a semiconductor wafer with the corresponding contact pad assemblies of a contactor card and then mates the card together such that the contact pins compliantly mate with the contact pads. Test signals are applied and monitored through the contactor card. In still another embodiment of the present invention, a semiconductor wafer testing system is provided and includes a contactor card as described and a tester for generating and analyzing test signals.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention, according to the various embodiments described, is drawn to compliant contacting structure and methods for providing electrically conductive contact pins formed from and within a generally planar substrate. The various views and diagrams are illustrated generally as cross-sectional views for clarity; however, the specific formed profiles and devices may be arranged across the surface of the substrate and with various orientations and geometries as are desirable, as will be appreciated by those of ordinary skill in the art.

Figure 1A:
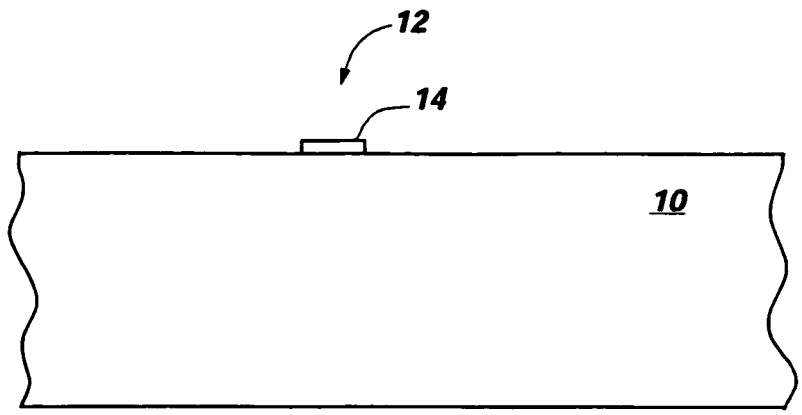
FIGS. 1A-1I show a sequence cross-sectional views illustrating the process steps of a method for fabricating a compliant contact pin assembly, according to an embodiment of the present invention.
Figure 1B:
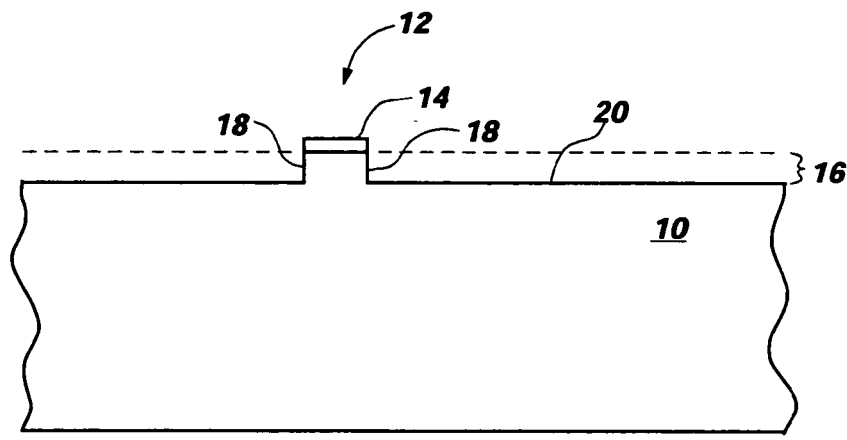

In FIG. 1A, substrate 10 has defined thereon a location 12 for the formation of a contact pin. Substrate 10 may comprise a silicon wafer, a ceramic substrate, a glass substrate, a quartz substrate, or other suitable material. At the location 12, a mask layer 14 is placed on the top or contact end side of substrate 10. The profile of mask layer 14 identifies the general cross-sectional geometry of an emerging contact pin to be formed at location 12. Mask layer 14 may be thermally grown silicon oxide, CVD silicon oxide, or CVD silicon nitride. Substrate 10 preferably includes a crystal orientation allowing for selectively etching as an isotropic etch. In FIG. 1B, the silicon etch is stopped at a distance 16 corresponding to an approximate contact pin travel distance. The contact pin travel distance may be heuristically derived as a function of the elasticity or flexibility of the compliant coupling means described below. As illustrated, the etch is preferably an isotropic etch resulting in side walls 18 that exhibit an approximate orthogonal relationship to thinned contact end surface 20.

Figure 1C:
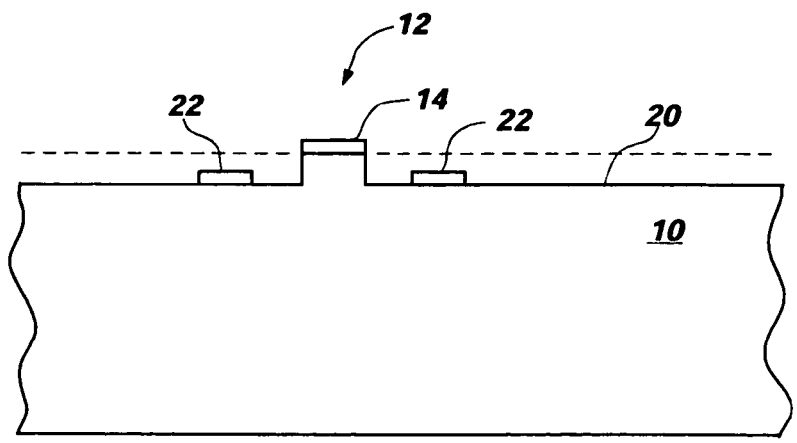

In FIG. 1C, additional mask layers 22 of the same general nature as mask layer 14 are placed on thinned contact end surface 20 for the formation of stops that regulate the travel distance of the contact pin under fabrication. It is noted that the stops may be discrete or generally continuous in circumscribing the emerging contact pin formed at location 12.

Figure 1D:
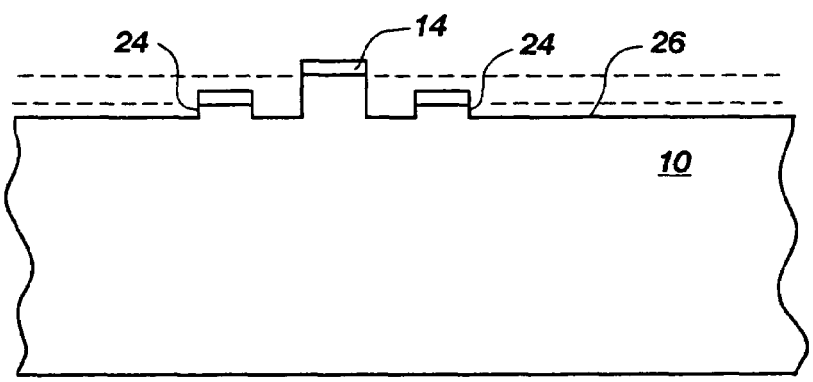
Figure 1E:
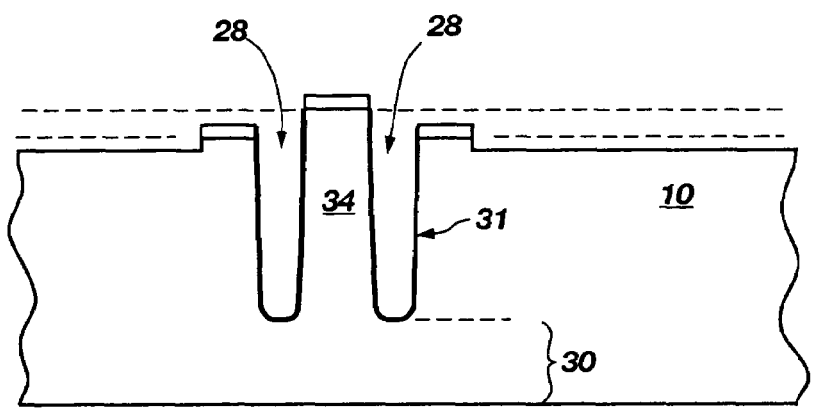

In FIG. 1D, substrate 10 has been further thinned or etched to form stops 24 that limit the distance of travel of the contact pin as well as provide a stand-off for particles or contaminants that may be present on the further thinned contact end surface 26 of substrate 10. In FIG. 1E, the maximum depth of the emerging contact pin 34 is defined through the formation of a void 28 surrounding the emerging contact pin 34. Void 28 may be formed in one of several manners including a photo etch process, wherein other portions of the substrate 10 are masked and protected from the etching process. Alternatively, void 28 may be formed through laser ablation or machining. Laser machining may be performed by a micro machining laser such as the XCISE 200 available from XSIL Ltd. of Dublin, Ireland.

Figure 1F:
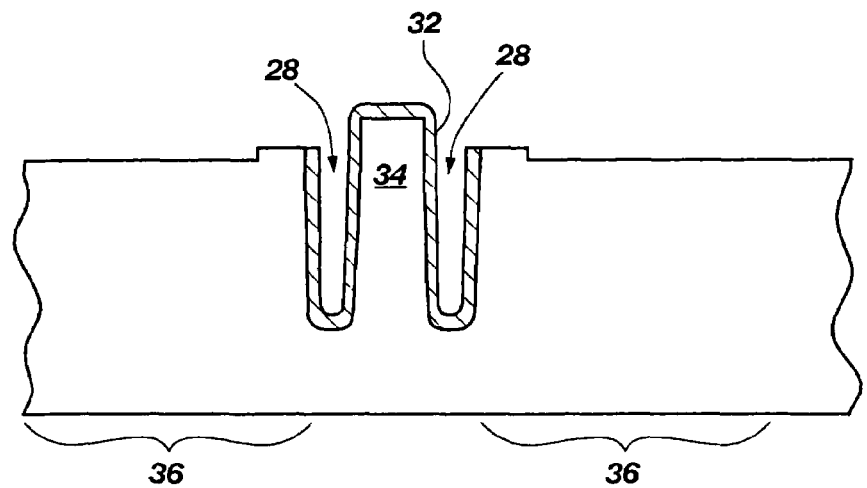

As illustrated in FIG. 1E, a thickness 30 of substrate 10 remains intact to support the emerging contact pin 34 through further manufacturing processes. If substrate 10 is comprised of a semiconductive or conductive material, an insulative layer 31, such as an oxide layer, is formed on the sidewalls of void 28. When substrate 10 is comprised of a nonconductive material, then an insulative layer is unnecessary. In one embodiment, the emerging contact pin 34, in addition to the surfaces defining void 28, are conductively coated by depositing a conductive material 32 generally over the emerging contact pin 34 and throughout the void 28. In one particular embodiment, as illustrated in FIG. 1F, conductive material 32 is formed through a metallic plating process, which results in conductive surfaces on remaining substrate portions 36 and on emerging contact pin 34.

Figure 1G:
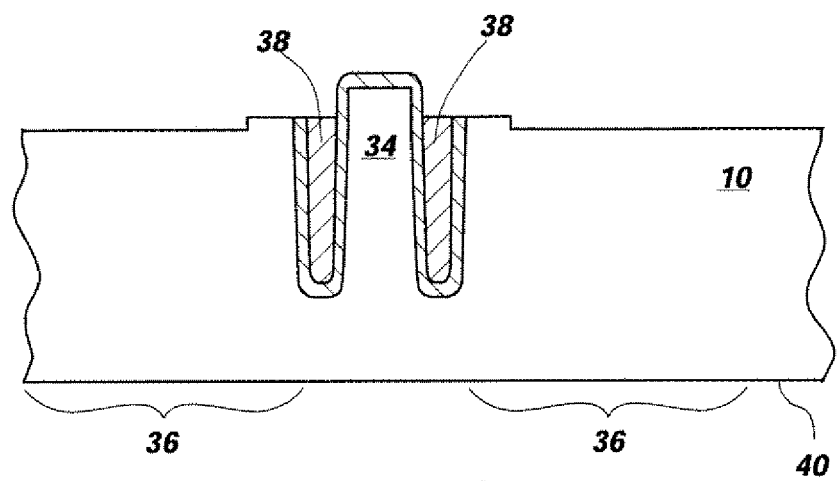

A compliant coupling structure couples emerging contact pin 34 with remaining substrate portions 36 of substrate 10. By way of example and not limitation, FIG. 1G illustrates one such structure as compliant coupling material 38. Compliant coupling material 38 at least partially fills void 28 and forms a resilient compliant interface between emerging contact pin 34 and remaining substrate portions 36 of substrate 10. One suitable type of compliant coupling material includes conductive filled elastomers, for example, those available from A. I. Technology, Inc. of Princeton Junction, N.J., and conductive filled polymers such as, for example, E3114-5 conductive polymer available from Epoxy Technology of Billerica, Mass.

Figure 1H:
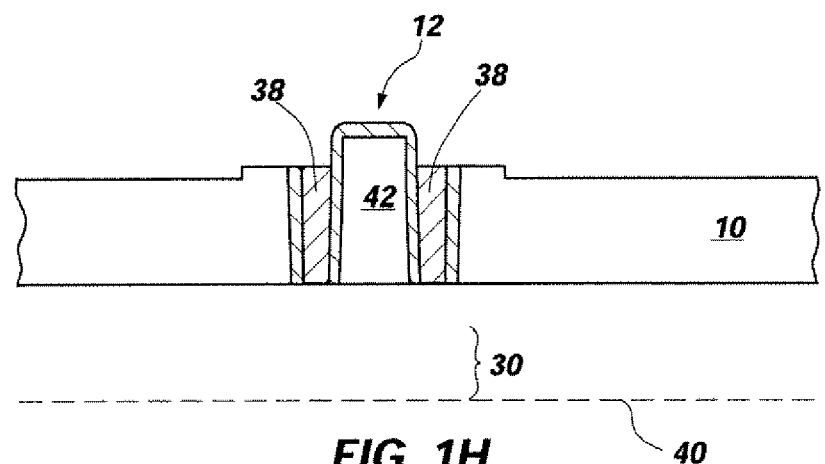

To enable compliant movement relative to the remaining substrate portions 36, the contact pin is released from the remaining substrate portions 36. In FIG. 1H, the back or opposite surface 40 of substrate 10 is thinned, either through an etching process or through a mechanical grinding process, for at least a thickness or distance 30 to release or free contact pin 42 from adjacent portions of substrate 10. As illustrated, contact pin 42 is formed from a portion of substrate 10 and remains positioned at original location 12 through compliant coupling means, namely compliant coupling material 38.

Figure 1I:
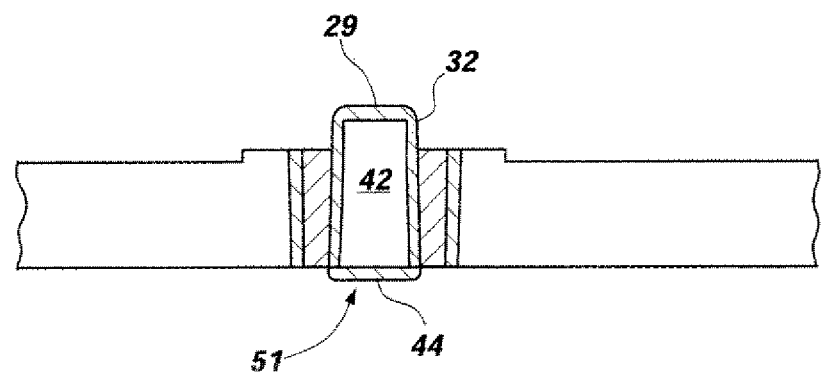

In a specific embodiment as illustrated in FIG. 1I, contact pin 42 is further coated with additional conductive material 44 at a bottom or interconnect end 51 to encapsulate the contact pin with additional conductive material. Consistent with the formation of conductive material 32 about the contact end 29 of contact pin 42 and throughout void 28, conductive material 44 may be formed through various processing steps including electroplating or other plating or coating techniques.

Figure 2:
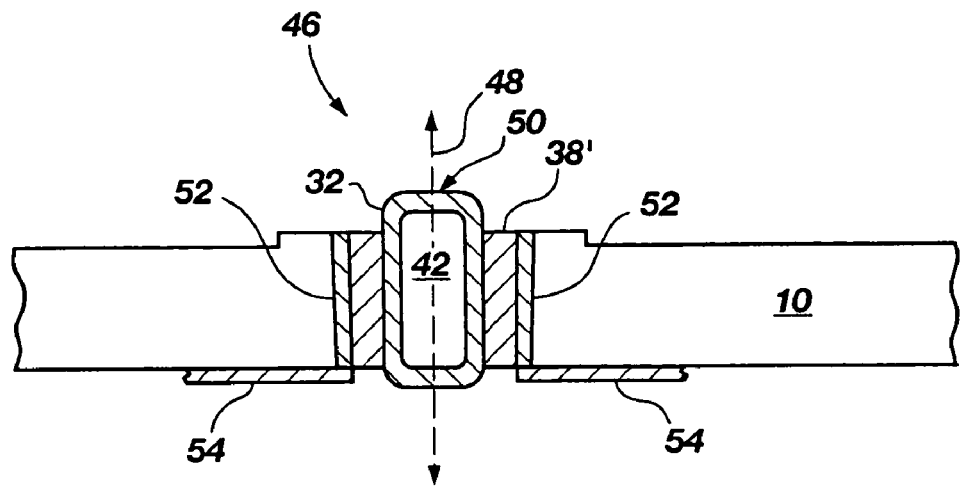
FIG. 2 is a cross-sectional view illustrating a compliant contact pin assembly, in accordance with one embodiment of the present invention.

FIG. 2 illustrates a contact pin assembly 46, in accordance with one embodiment of the present invention. A compliant axis 48 illustrates the axis of motion of contact pin 42 as a result of the resilient or elastic nature of compliant coupling material 38'. Furthermore, in one exemplary embodiment, the compliant coupling material is electrically conductive and is illustrated as compliant coupling material 38'. Electrical continuity exists from contact tip or contact end 50 of contact pin 42 to substrate 10 by way of conductive material 32 electrically coupled with electrically conductive compliant coupling material 38', which further is electrically coupled to portion 52 of the conductive material affixed to the remaining substrate 10. Routing of a signal detected at contact end 50 of contact pin 42 may be further routed via one or more conductive traces 54 to other desirable locations. Conductive trace 54 may be formed according to various interconnection techniques including masking, deposition, and etching techniques, the specifics of which are appreciated by those of ordinary skill in the art.

Figure 3:
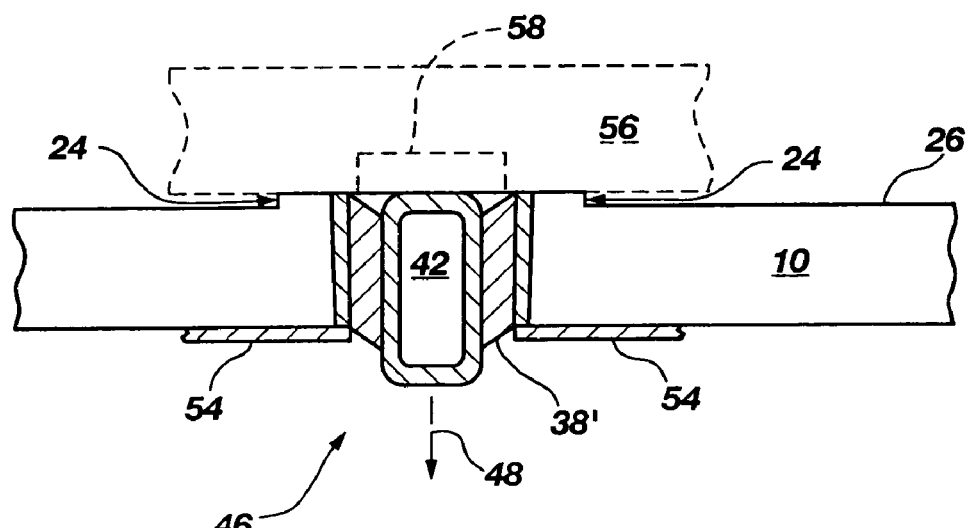
FIG. 3 is a cross-sectional view of a compliant contact pin assembly in a compliant state, in accordance with an embodiment of the present invention.

In FIG. 3, contact pin assembly 46 is illustrated in a compliant state responsive to a device-under-test 56, for example, a semiconductor wafer, with a contact pad 58. The mating or coupling of the device-under-test 56 causes the displacement of contact pin 42 along a compliant axis 48 as compliant coupling material 38' resiliently deforms or compliantly responds thereto. As illustrated, stops 24 restrict the distance of travel of contact pin 42 and further protect the device-under-test 56 and contact pin assembly 46 from damage due to contaminants, for example, particles between device-under-test 56 and further thinned contact end surface 26.

Figure 4:
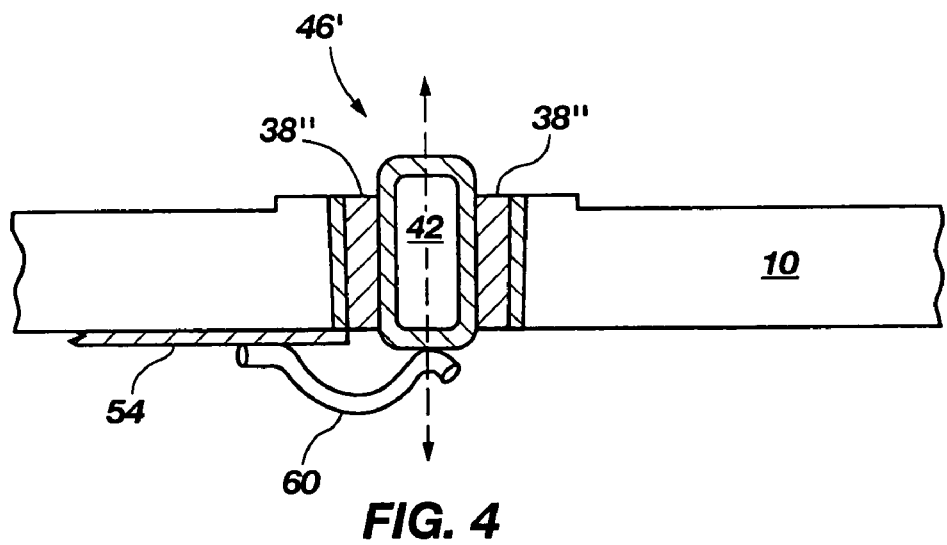
FIG. 4 is a cross-sectional view of a compliant contact pin assembly, in accordance with another embodiment of the present invention.

FIG. 4 illustrates a contact pin assembly, in accordance with another embodiment of the present invention. Contact pin assembly 46' includes a contact pin 42 compliantly retained in substrate 10 by way of a nonconductive compliant coupling material 38". Because of the nonconductive nature of compliant coupling material 38", electrical coupling must be provided from contact pin 42 to surrounding substrate 10. In the present embodiment, a wire bond 60 is applied between contact pin 42 and conductive trace 54. Wire bonding techniques are known by those of ordinary skill in the art and further discussion of such process is not contained herein.

Figure 5:
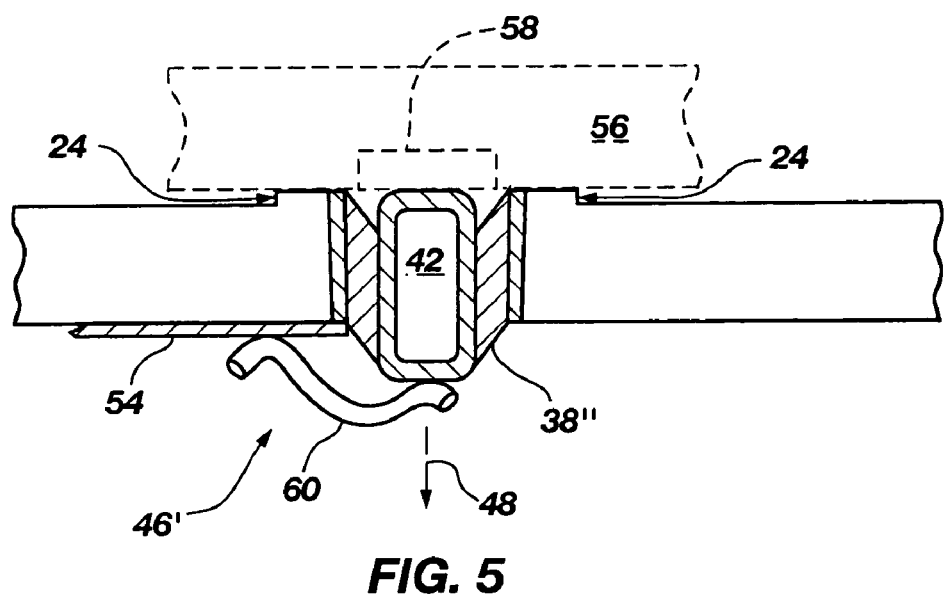
FIG. 5 is a cross-sectional view of a compliant contact pin assembly in a compliant state, in accordance with another embodiment of the present invention.

FIG. 5 illustrates a coupling of a device-under-test 56 having a contact pad 58 mating with contact pin assembly 46'. As illustrated, contact pin 42 compliantly deflects along compliant axis 48 due to the resiliency of compliant coupling material 38". Also illustrated, wire bond 60 further deforms in response to the compliant motion of contact pin 42, thereby maintaining electrical continuity between contact pin 42 and conductive trace 54.

Figure 6A:
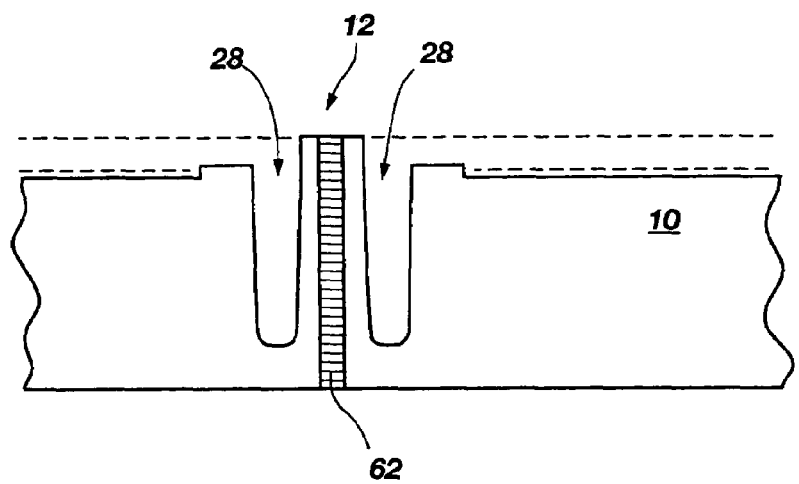
FIGS. 6A-6E show a sequence of cross-sectional views illustrating a portion of the process steps of a method for fabricating a compliant contact pin assembly, in accordance with one or more other embodiments of the present invention.
Figure 6B:
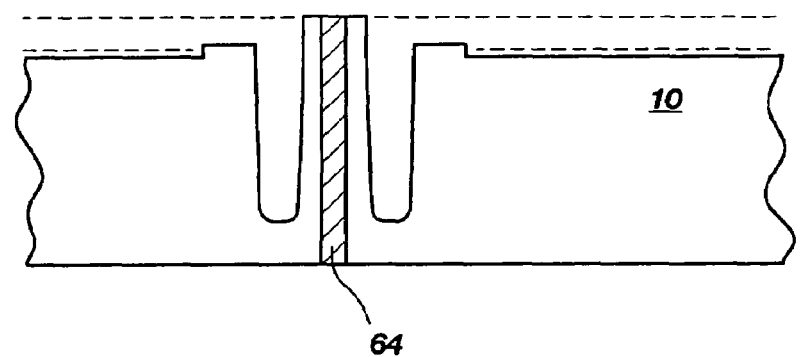
Figure 6C:
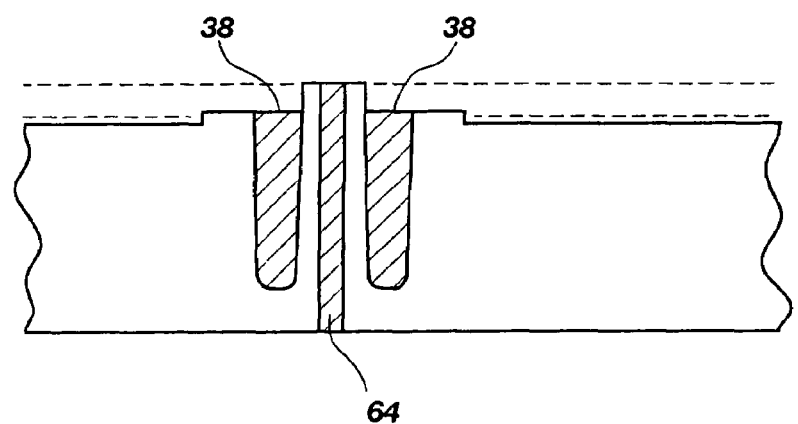
Figure 6D:
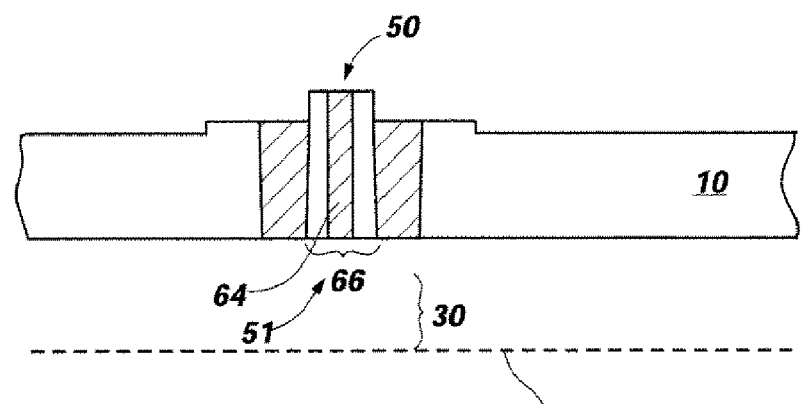

FIGS. 6A-6D illustrate yet another method of formation of a contact pin for use in a contact pin assembly, in accordance with another embodiment of the present invention. In the present embodiment, processing of substrate 10 follows preliminary processing steps according to FIGS. 1A-1E. Prior thereto, however, a bore 62 is formed entirely through substrate 10, for example, centered within location 12, and through the emerging contact pin. Boring techniques may include those utilized for the formation of voids 28, namely etching and or laser ablating techniques. In FIG. 6B, bore 62 (FIG. 6A) is filled with a conductive material 64, which may be formed using plating, sputtering, squeegeeing or other conductive fill techniques known by those of ordinary skill in the art. This may also be effected prior to the steps of FIGS. 1A-1E. In FIG. 6C, voids 28 (FIG. 6A) are filled with compliant coupling material 38 according to techniques described above with reference to FIG. 1G. In FIG. 6D, an etching or abrasive process, such as mechanical grinding or abrasive planarization such as Chemical Mechanical Planarization (CMP), removes the back side of substrate 10 for at least a distance or thickness 30 to release the emerging contact pin to form contact pin 66.

Figure 6E:
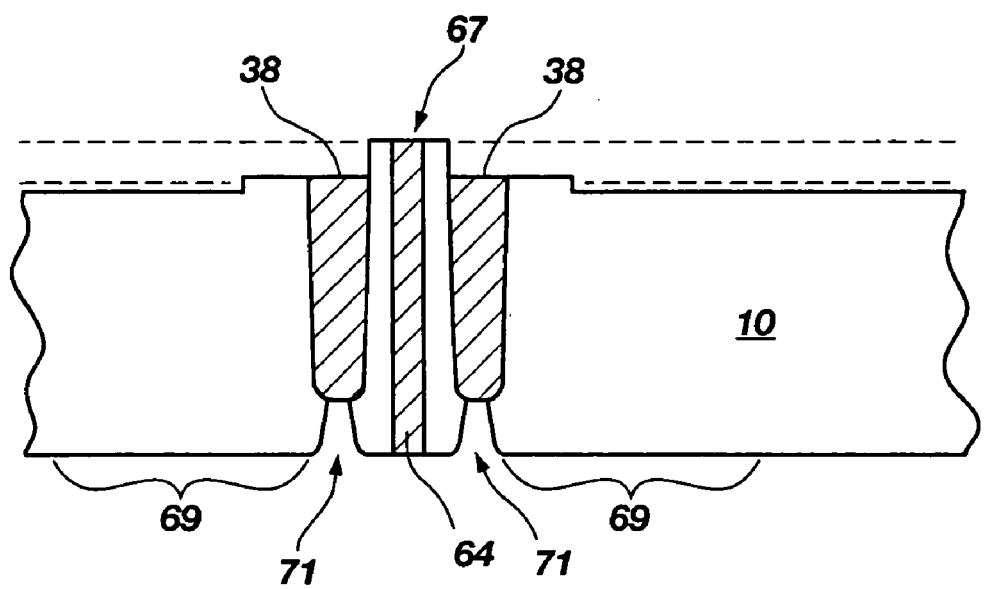

FIG. 6E illustrates an alternative approach for releasing the emerging contact pin to form contact pin 67. In the present embodiment of the present invention, contact pin 67 is released by isolating contact pin 67 from remaining substrate portions 69 of substrate 10 by forming voids 71 through one or more substrate removal processes previously described. Such processes include etching, laser machining, and mechanical routing, etc.

Figure 7:
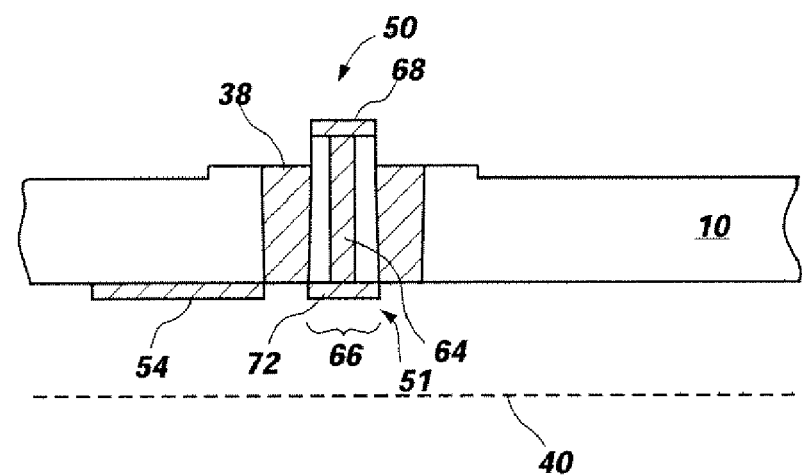
FIG. 7 is a cross-sectional view illustrating a further process of forming a contact tip, in accordance with a further embodiment of the present invention.
Figure 8:
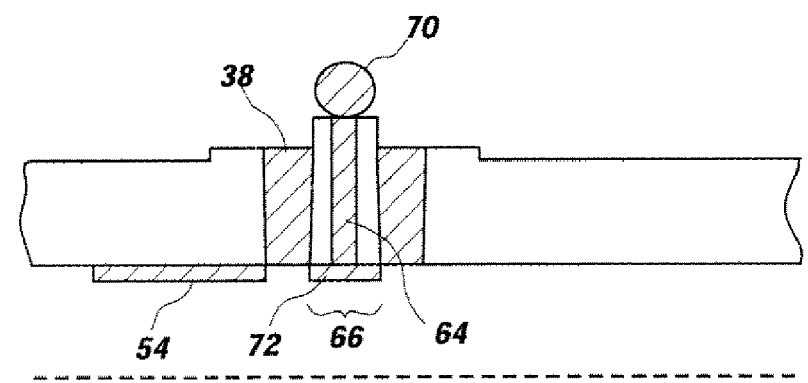
FIG. 8 is a cross-sectional view illustrating a further process of forming a contact tip, in accordance with another embodiment of the present invention.

The ends of contact pin 66 are preferably conductively coated to further facilitate electrical coupling. FIG. 7 and FIG. 8 illustrate various contact ends or tips that may be formed upon contact pins 66, 67, in accordance with respective embodiments of the present invention. In FIG. 7, a conductive material 68 is formed to provide electrical continuity with conductive material 64. Conductive material 68 may be formed using plating or other deposition processes, which results in a conductive contact surface for mating with device-under-test 56 (FIGS. 3 and 5). In FIG. 8, a bump of conductive material 70 is formed on contact pin 66 for providing electrical continuity with conductive material 64. In the present embodiment, conductive material 70 may be formed using solder bumping technology, such as that utilized in the formation of balls of a ball grid array (BGA) or by using a wire bond capillary to place a bump of conductive material 70. The formation of such conductive bumps is known by those of ordinary skill in the art and is not further described herein.

FIGS. 7 and 8 further illustrate the formation of one or more conductive traces 54 and the electrical coupling of conductive material 64 with a yet further conductive material 72, for providing electrical conduction with a compliant coupling material 38. The embodiments as illustrated in FIGS. 7 and 8 may also incorporate a wire bond 60 (FIG. 4) when nonelectrically conductive compliant coupling material is employed.

Figure 9:
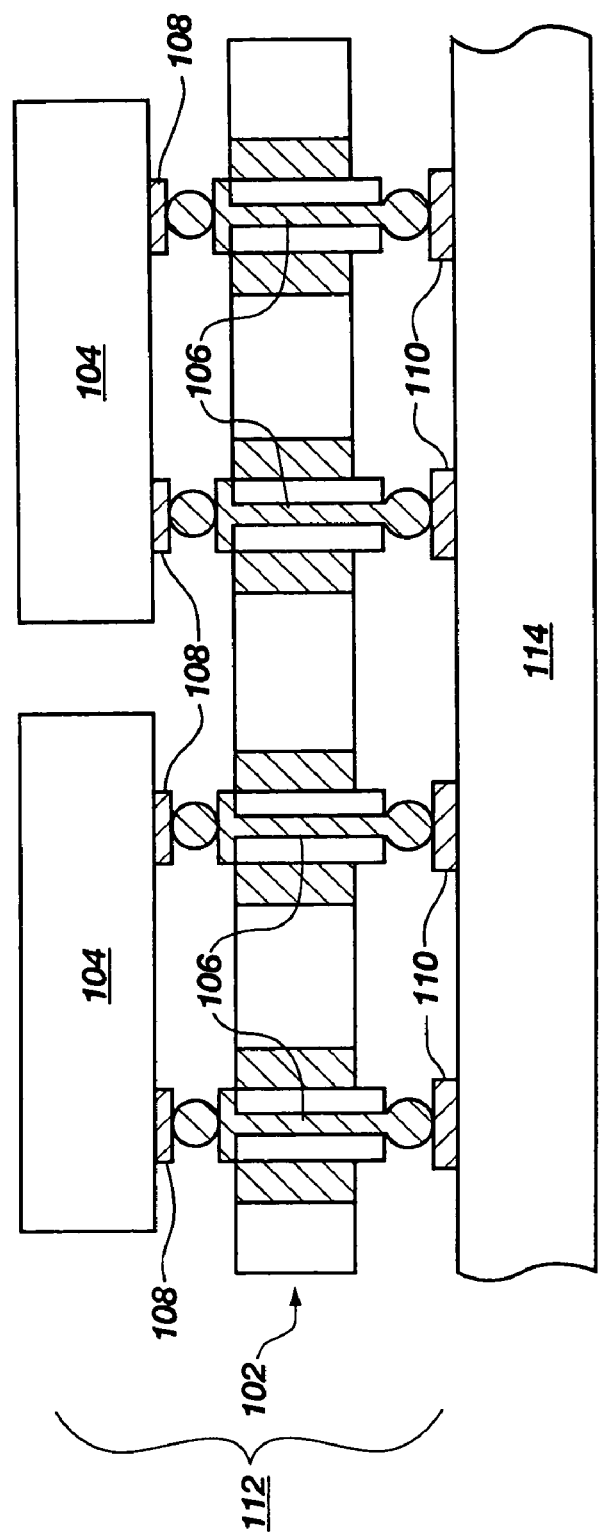
FIG. 9 illustrates a device assembly utilizing a contact pin assembly, in accordance with another embodiment of the present invention.

FIG. 9 illustrates a device assembly utilizing a contact pin assembly, in accordance with another embodiment of the present invention. While compliant coupling of a contact pin assembly for temporary interconnection with a device-under-test is illustrated herein, various embodiments of the present invention also find application when permanently coupled with one or more devices to form a device assembly for further integration or coupling with a substrate, such as a printed circuit board. A device assembly 112 includes a contact pin assembly 102, formed in accordance with the one or more embodiments described herein, and one or more devices 104 permanently coupled thereto. The one or more devices 104 include one or more contact pads 108 that electrically interface with the one or more contact pins 106 of the contact pin assembly 102. The device assembly 112 may then be further coupled to outer lead contact pads 110 on a substrate 114. Electrical coupling techniques for coupling devices 104 to substrate 114 via the contact pin assembly 102 are appreciated by those of ordinary skill in the art and therefore are not further described herein.

Coupling of one or more devices 104 to a substrate 114 via a contact pin assembly 102 finds application by providing an intermediary expansion medium, namely the contact pin assembly 102, for mediating variations in the expansion between devices 104 and substrate 114 when operated over temperature variations. Electrical continuity between contact pads 108 and 110 is maintained by the compliant coupling material of the contact pins 106 within the contact pin assembly 102.

Figure 10:
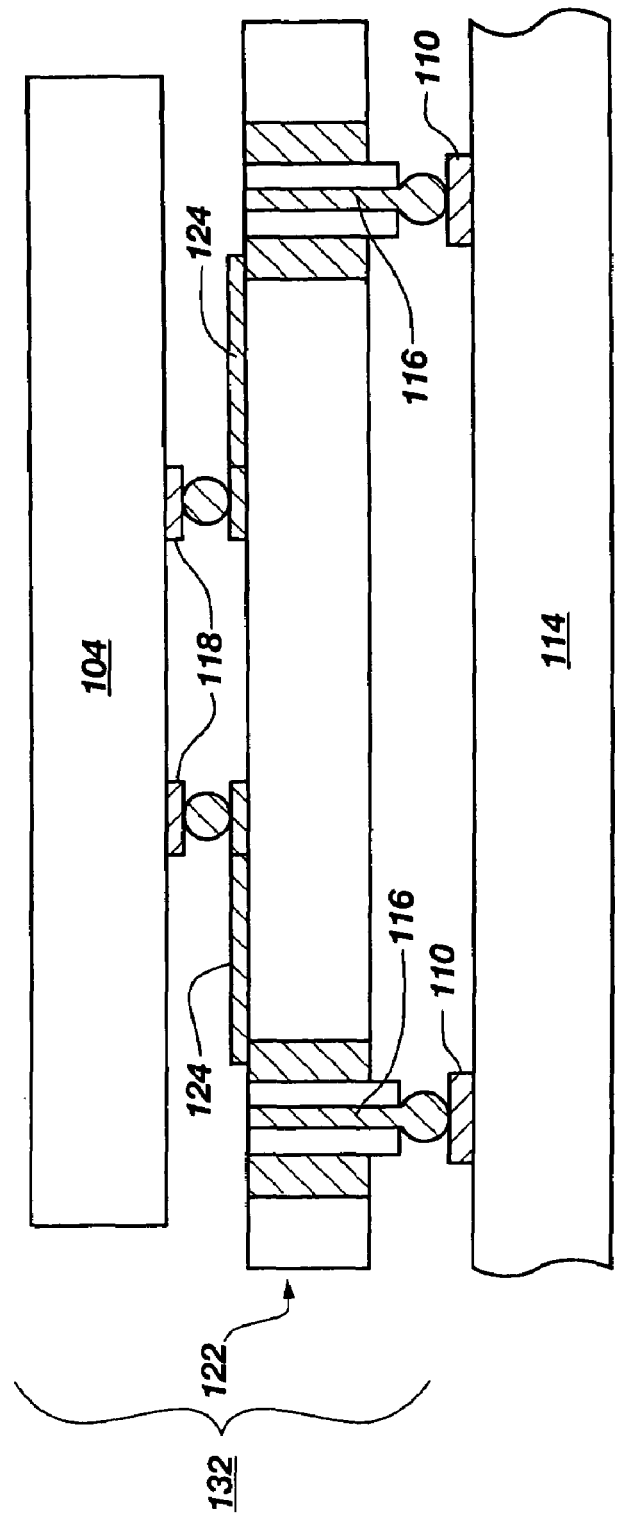
FIG. 10 illustrates a device assembly utilizing a contact pin assembly, in accordance with yet another embodiment of the present invention.

FIG. 10 illustrates a device assembly utilizing a contact pin assembly, in accordance with yet another embodiment of the present invention. In the present embodiment, a redistribution layer may be implanted through the use of a contact pin assembly external to the active devices. Those of skill in the art appreciate that additional processing steps performed on active devices result in a decreased yield of operation devices due to the additional handling and processing parameters, such as elevated temperatures. Therefore, in the present embodiment, the redistribution of inner lead contact pads 118 to outer lead contact pads 110 is accomplished through coupling a contact pin assembly 122 to a device 104. Specifically, a device assembly 132 includes a contact pin assembly 122, formed in accordance with the one or more embodiments described herein, and one or more devices 104 permanently coupled thereto. The one or more devices 104 include one or more inner lead contact pads 118 that electrically interface with the one or more contact pins 116 of the contact pin assembly 122. The device assembly 132 may then be further coupled to outer lead contact pads 110 on a substrate 114. Electrical coupling techniques for coupling devices 104 to substrate 114 via the contact pin assembly 122 are appreciated by those of ordinary skill in the art and therefore are not further described herein.

Coupling of a device 104 to a substrate 114 via a contact pin assembly 122 finds application by providing an intermediary expansion medium, namely the contact pin assembly 122, for mediating variations in the expansion and redistributing interconnects from an inner lead contact pad 118 to an outer lead contact pad 110. Electrical continuity between contact pads 108 and 110 is maintained by the compliant coupling material of the contact pins 116 and a redistribution conductive trace 124 within the contact pin assembly 122.

Figure 11A:
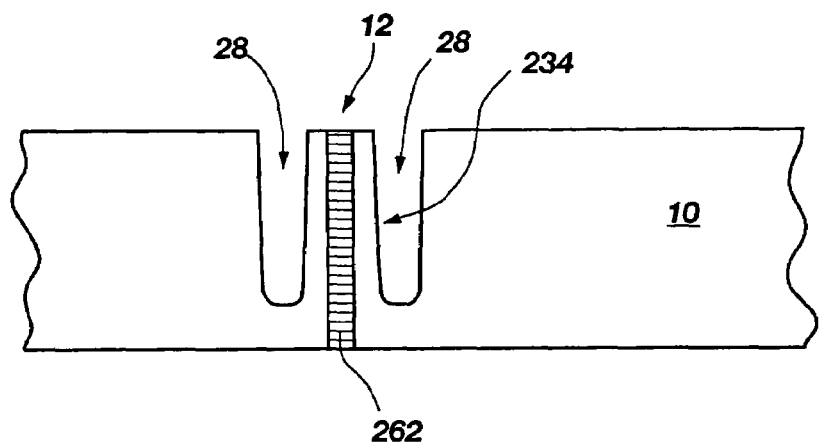
FIGS. 11A-11C show a sequence of cross-sectional views illustrating a compliant contact pin assembly, in accordance with another embodiment of the present invention.
Figure 11B:
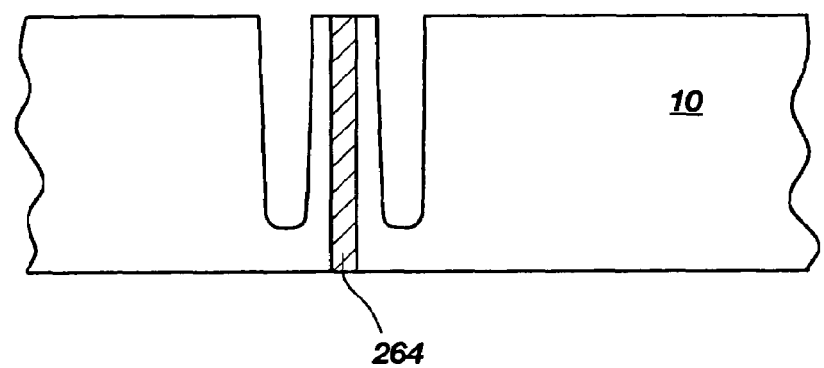
Figure 11C:
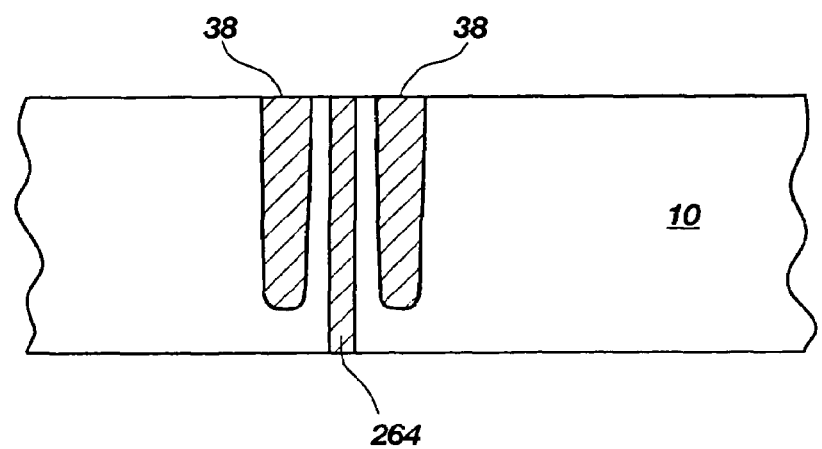

FIGS. 11A-11C illustrate yet another embodiment of a contact pin for use in a contact pin assembly, in accordance with embodiments of the present invention. In the present embodiment, additional compliance is provided by the extension of a conductive material beyond the thinned back side surface of substrate 10 or, in yet another embodiment, through the capping of the contact pin with compliant conductive "bricks" or "blocks." In the present embodiments, processing of substrate 10 undergoes processes described above for the formation of a void 28 surrounding the emerging contact pin 234. Void 28 may be formed in one of several manners described above including a photo etch process, laser machining, or mechanical drilling.

A bore 262 is formed entirely through substrate 10, exemplarily centered about location 12, and through the emerging contact pin 234. Boring techniques may include those utilized for the formation of voids 28, namely etching and/or laser ablating techniques. In FIG. 11B, bore 262 (FIG. 11A) is filled with a conductive material 264, which may be formed from a conductive polymer. While the filling process may be done using various techniques, two exemplary techniques, including squeegeeing the material through, or drawing the material through bore 262, are contemplated. In FIG. 11C, voids 28 are filled with compliant coupling material 38 according to techniques described above with reference to FIG. 1G and the contact pin is released from the remaining substrate portions, according to the process described above with reference to FIG. 1H, wherein the back or opposite surface 40 of substrate 10 is thinned, either through an etching process or through a mechanical grinding process.

Figure 12A:
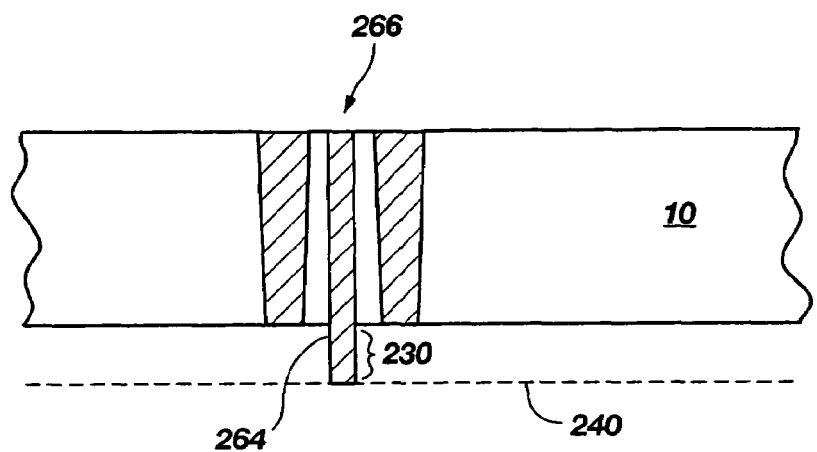
FIGS. 12A-12C show a sequence of cross-sectional views illustrating a further portion of the process steps for fabricating contact ends on a compliant contact pin assembly, in accordance with one or more other embodiments of the present invention.
Figure 12B:
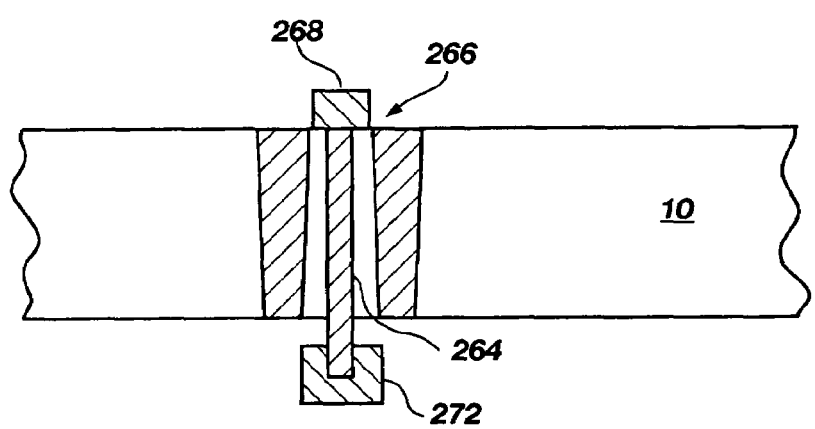
Figure 12C:
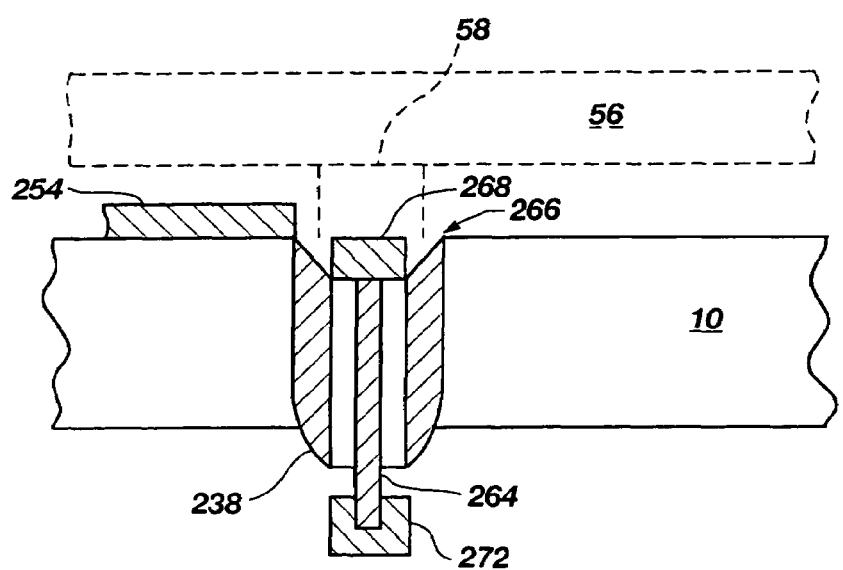
Figure 13A:
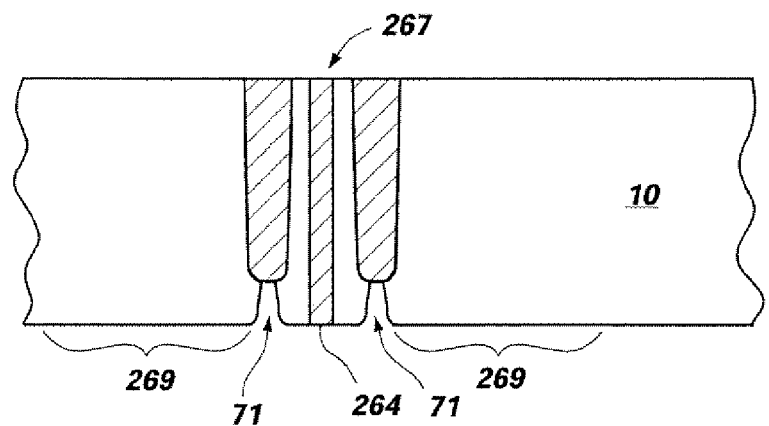
FIGS. 13A-13C show a sequence of cross-sectional views illustrating a further portion of the process steps for fabricating contact ends on a compliant contact pin assembly, in accordance with one or more other embodiments of the present invention.

FIGS. 12A-12C and 13A-13C illustrate separate embodiments for releasing the emerging contact pin 234 (FIG. 11A) from the remaining substrate portions and for electrically capping the contact pin. In FIG. 12A, a masking and etching process is used to remove the back side of substrate 10 from surface 240 for at least a distance 230 to release the emerging contact pin to form contact pin 266. FIG. 13A illustrates an alternative approach for releasing the emerging contact pin to form contact pin 267. In the embodiment as illustrated in FIG. 13A, contact pin 267 is released by isolating contact pin 267 from remaining substrate portions 269 of substrate 10 by forming voids 71 through one or more substrate removal processes previously described. Such processes include masking and etching, laser machining and mechanical routing, etc.

Figure 13B:
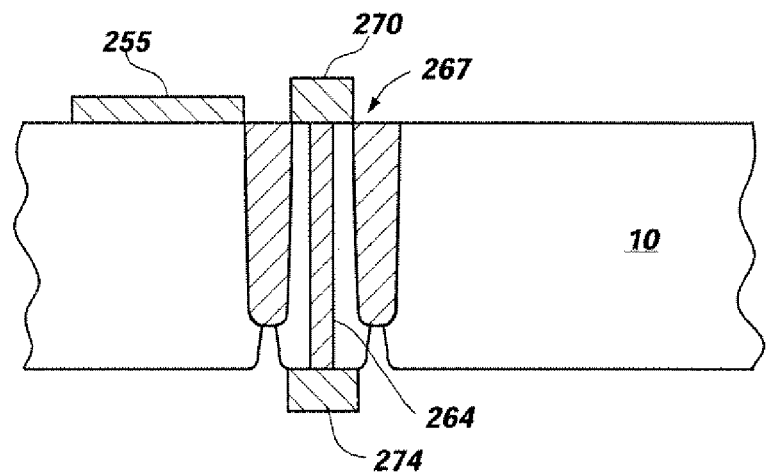
Figure 13C:
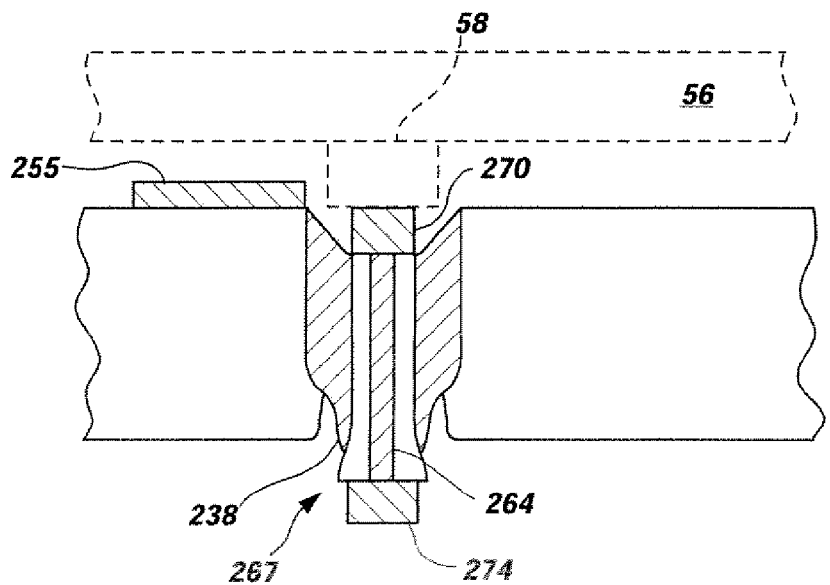

The ends of contact pins 266, 267 are preferably coated to further facilitate electrical coupling and/or to extend the end of the contact pin above the substrate. FIG. 12B and FIG. 13B illustrate various contact ends or tips that may be formed upon contact pins 266, 267, in accordance with respective embodiments of the present invention. In FIG. 12B, conductive material 268 and 272 is formed to provide electrical continuity with conductive material 264. Conductive material 268 and 272 may be formed using plating or other deposition processes, including the formation of conductive polymer bricks or blocks, which results in a conductive contact surface for mating with contact pad 58 of device-under-test 56 (FIG. 12C). In FIG. 13B, conductive material 270, 274 is formed on contact pin 267 for providing electrical continuity with conductive material 264. In the present embodiments, conductive material 270 and 274 may be formed using, for example, conductive deposition techniques described above, conductive polymer bricks on the top and/or bottom of contact pin 267, which results in a conductive contact surface for mating with contact pad 58 of a device-under-test 56 (FIG. 13C). Conductive material 270 and 274 formed of conductive polymers may provide additional compliant force due to the intrinsic compressibility of, for example, the polymer.

As a further enhancement to the contact pin 267, while the conductive material 270, 274, is in a "wet" or semi-cured state, flakes of material such as dendritic material for scrubbing the material to be probed by the contact pin may be applied to conductive material 270, 274. FIGS. 12C and 13C further illustrate the formation of one or more conductive traces 254, 255 and the electrical coupling of conductive material 264 with a yet further conductive material 268, 272 and 270, 274, for providing electrical conduction with a conductive compliant material 238.

FIGS. 14A-14G show a sequence of cross-sectional views illustrating a portion of the process steps of a method for fabricating a compliant contact pin assembly, according to another embodiment of the present invention. The present embodiment utilizes an initial masking process to develop a very fine resolution pin outline having one or more pyramid-like shapes. Additional texturing or profiles may be developed for facilitating enhanced coupling by the contact pin, such as, for example, penetrating an oxide layer on an integrated circuit pad.

Figure 14A:
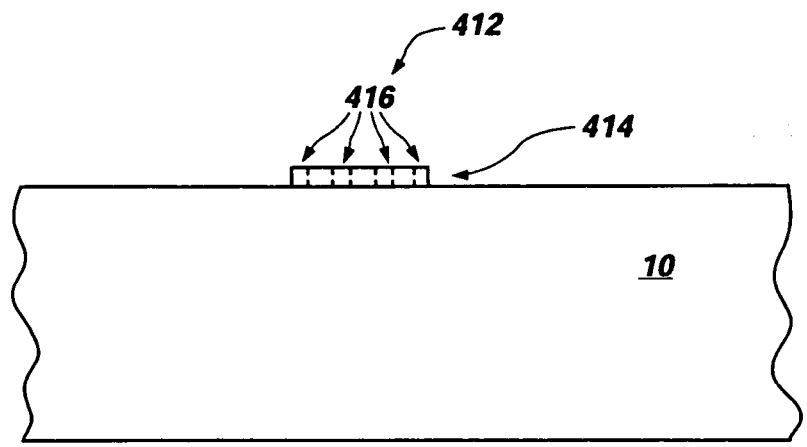
FIGS. 14A-14G show a sequence of cross-sectional views illustrating a portion of the process steps of a method for fabricating a compliant contact pin assembly, in accordance with yet one or more other embodiments of the present invention.

In FIG. 14A, substrate 10 has defined thereon a location 412 for the formation of a contact pin. At the location 412, a mask layer 414 is placed on the top or contact end side of substrate 10. The profile of mask layer 414 identifies the general cross-sectional geometry of an emerging contact pin. Mask layer 414 may be one of various masking compositions and is preferably a nitride mask, commonly known as a "nitride hard mask." While mask layer 414 may completely mask the area of the substrate 10 at location 412, FIG. 14A further illustrates another optional aspect of the invention wherein texturing or profiles may be formed using one or more openings or apertures within mask layer 414, an example of which is illustrated as apertures 416. When profiles are desired at the contact end of the contact pin, a first mask layer 414 is placed at location 412 to form any desired profile features, such as stops or self-limiting contacts. Substrate 10 may be etched under controlled conditions to obtain the fine profile features. A mask layer 414 may be placed over the entire location 412 including the formed profiles. Substrate 10 is bulk etched using, for example, a KOH etch process to obtain a pyramidal-shaped etch plane.

Figure 14B:
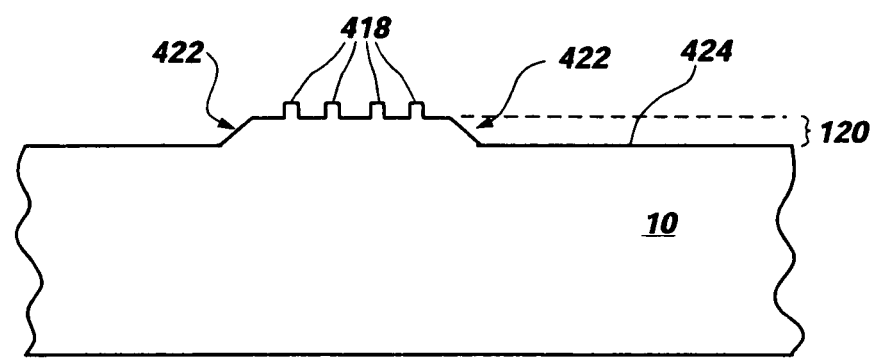

In FIG. 14B, the processing of apertures 416 results in the formation of profiles 418 configured for enhancing the penetration of, for example, oxide layers inhibiting direct contact with underlying conductive contacts or traces of an integrated circuit pad. By way of relative dimensioning, profiles 418 are relatively short in order to be self-limiting when subjected to a contact pad of a device-under-test. By way of example and not limitation, profiles 418 may be fabricated with a height of approximately 0.33 µm. While FIGS. 14A-14G illustrate the formation of profiles 418, the formation of the profiles 418 is optional.

In FIG. 14B, the silicon etch is stopped at a distance 120 corresponding to an approximate contact pin travel distance. The contact pin travel distance may be heuristically derived as a function of the elasticity or flexibility of the compliant coupling means described, and, for one application, may be on the order of 75 µm. As illustrated, the etch is preferably an isotropic etch resulting in the side walls 422, which exhibit an approximate pyramidal relationship to thinned contact end surface 424.

Figure 14C:
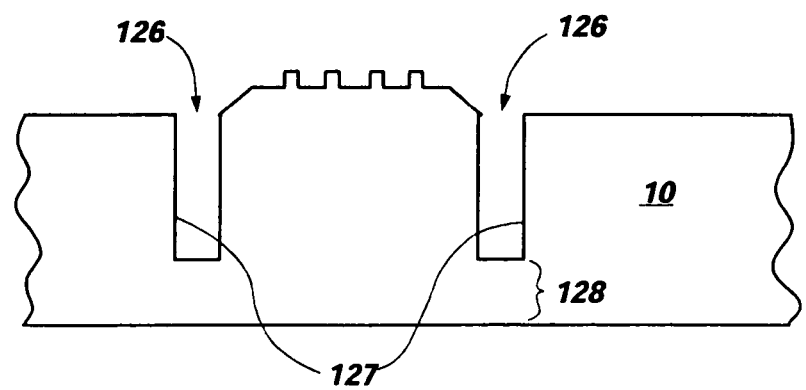

In FIG. 14C, the depth of the emerging contact pin is generally defined through the formation of a void 126 surrounding the emerging contact pin. Void 126 may be formed in one of several manners including a photo etch process wherein other portions of the substrate are masked and protected from the etching process. Alternatively, void 126 may be formed through laser ablation or machining, as described above with reference to FIG. 1E. As illustrated in FIG. 14C, a thickness 128 of substrate 10 remains intact to support the emerging contact pin through further manufacturing processes. When substrate 10 is semiconductive or conductive, an insulating oxide layer 127 is formed within void 126 to insulate any electrical signals from becoming shorted or exhibiting cross-talk.

Figure 14D:
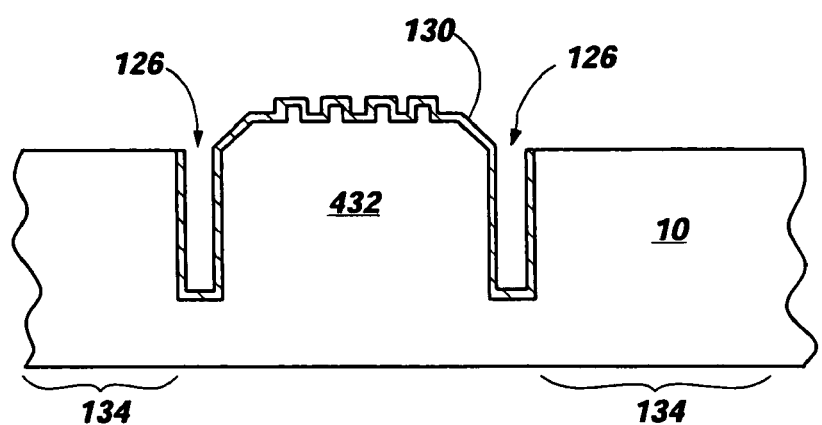

In FIG. 14D, the emerging contact pin 432 in addition to the surfaces of void 126 are conductively coated by depositing a conductive material 130 generally over the emerging contact pin 432 and throughout the void 126. Conductive material 130 may be formed through a metallic plating process, sputtering process, or other particle deposition process, which results in conductive surfaces on remaining substrate portions 134 and on emerging contact pin 432.

Figure 14E:
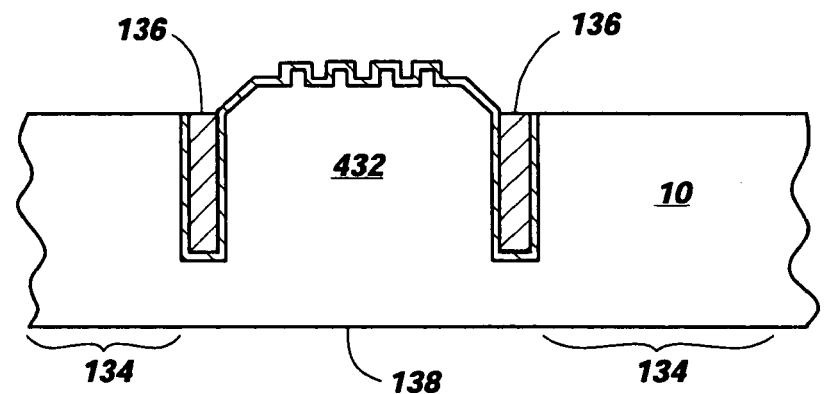
Figure 14F:
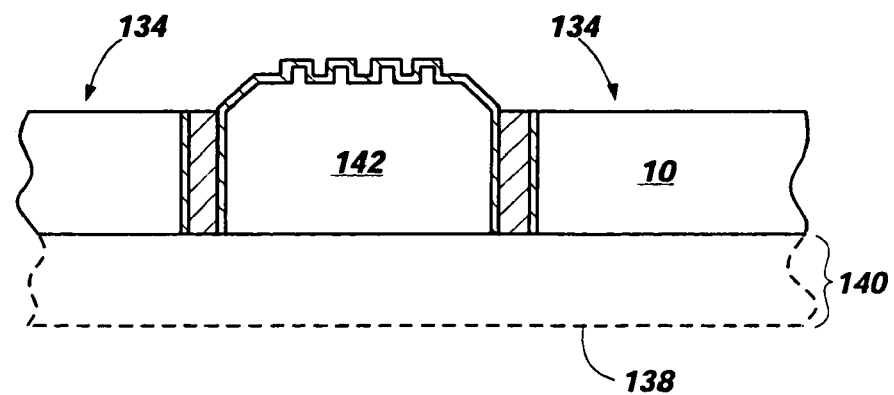

A compliant coupling structure couples emerging contact pin 432 with remaining substrate portions 134 of substrate 10. By way of example and not limitation, FIG. 14E illustrates one such structure as compliant coupling material 136. Compliant coupling material 136 at least partially fills void 126 and forms a flexible or compliant interface between emerging contact pin 432 and remaining substrate portions 134 of substrate 10. In FIG. 14F, the back or opposite surface 138 of substrate 10 is thinned either through an etching process or through a mechanical grinding or abrasion process for at least a thickness or distance 140 to release or free contact pin 142 from adjacent substrate portions 134 of substrate 10. As illustrated, contact pin 142 is formed from a portion of substrate 10 and remains positioned at original location 412 (see FIG. 14A) through compliant coupling means, namely compliant coupling material 136.

Figure 14G:
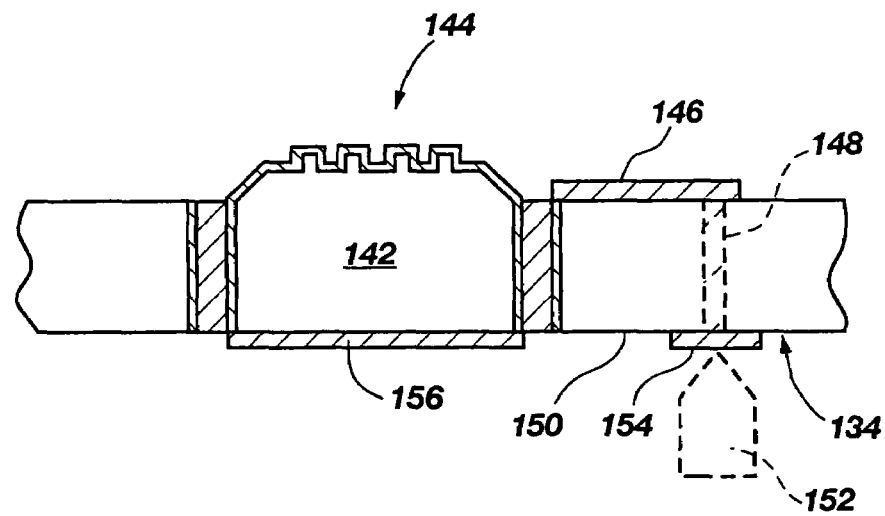

In FIG. 14G, contact pin assembly 144 may further include a redistribution layer, such as conductive trace 146, for electrically routing contact pin 142 to a separate location.

FIG. 14G further illustrates a via 148 that may further electrically couple conductive trace 146 to an opposite side 150 of substrate portions 134 of substrate 10 for further routing on opposite side 150 or for coupling with a probe 152 at a contact pad 154. Additionally, contact pin 142 may be further coated with additional conductive material 156 at a bottom or interconnect end to encapsulate the contact pin 142. Consistent with the formation of conductive material 130 (FIG. 14D) about the contact end of contact pin 432 and throughout void 126, conductive material 156 may be formed through various processing steps including plating, sputtering, or other coating approaches.

Figure 15:
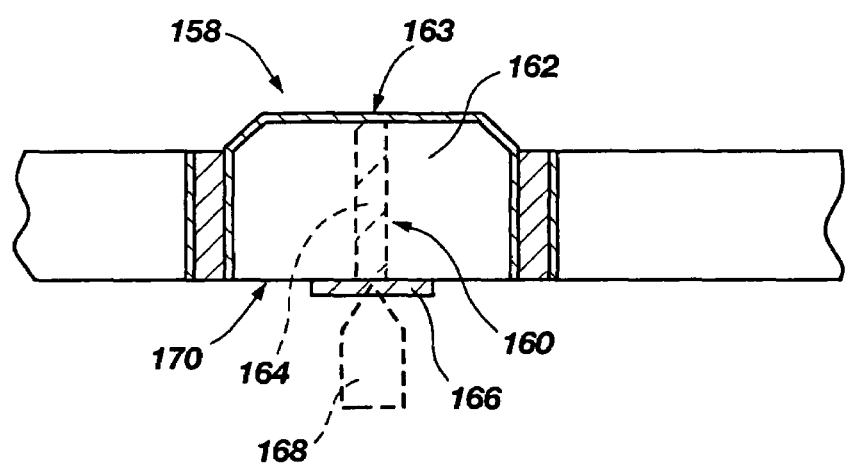
FIG. 15 shows a cross-sectional view of a compliant contact pin assembly, in accordance with a further embodiment of the present invention.

FIG. 15 shows a cross-sectional view illustrating a compliant contact pin assembly, according to yet another embodiment of the present invention. The present embodiment accommodates inline probing of the back of the contact pin 162, without subjecting the contact pad of a device-under-test to the damaging effects of a direct probe. A contact pin assembly 158 is generally fabricated according to the steps of FIGS. 14A-14E, however, a via 160 is formed, for example, through laser machining, through the contact pin 162. Via 160 is then filled with a conductive material 164 for electrically coupling the contact end 163 of contact pin 162 with the opposite side 170 of contact pin assembly 158. An additional contact pad 166 may be further formed for direct probing by a probe 168.

FIGS. 16A-16F and FIG. 17 show cross-sectional views illustrating various embodiments of dual-sided compliant contact pin assemblies. These embodiments facilitate the formation of compliant contacts on both sides of a contact pin assembly to accommodate an offset configuration or a redistribution arrangement.

Figure 16A:
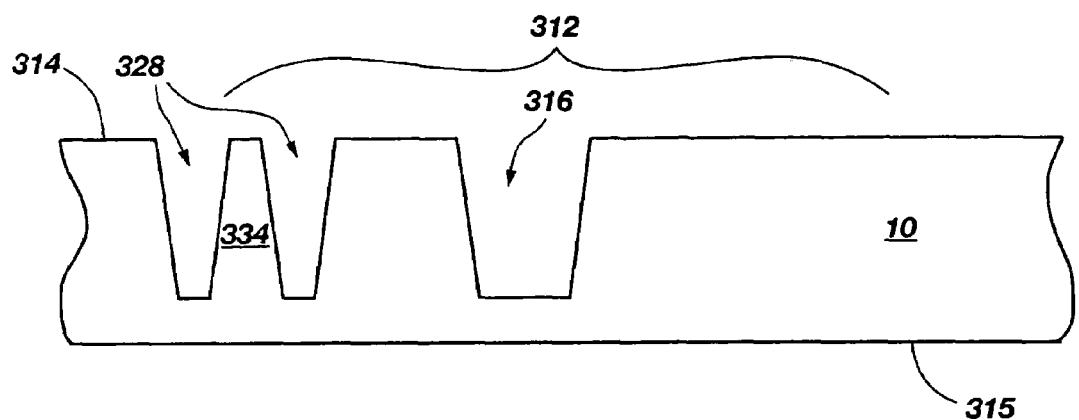
FIGS. 16A-16F show a sequence of cross-sectional views illustrating a portion of the process steps of a method for fabricating a double-sided compliant contact pin assembly, in accordance with a yet further embodiment of the present invention.

In FIG. 16A, substrate 10 has defined thereon a region or location 312 for the formation of a dual-sided contact pin assembly. In the present embodiment, the contact pin assembly is comprised of a contact pin on each surface or side of the substrate 10 that is electrically coupled together. At the location 312, an emerging contact pin 334 on a first side 314 is located and defined through the formation of voids 328, according to one or more of the substrate removal techniques described above, surrounding the emerging contact pin 334. A via void 316 is also formed partially through substrate 10 also using one or more of the substrate removal techniques described herein. Via void 316 provides an aperture for the formation of an electrical connection therethrough between first side 314 and second side 315.

Figure 16B:
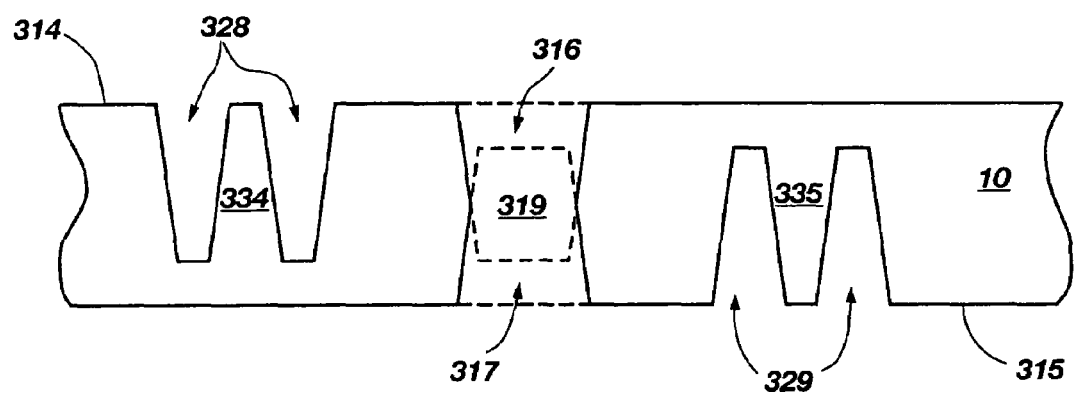

In FIG. 16B, an emerging contact pin 335 is defined through the formation of voids 329 surrounding emerging contact pin 335, according to one or more of the substrate removal techniques described herein. A via void 317 provides an aperture partially through substrate 10 from second side 315. Via voids 316 and 317 form a via void through the entire thickness of substrate 10 accommodating the formation of electrical continuity between the contact pins 334, 335, respectively, formed on sides 314 and 315.

When laser machining or other coarse substrate removal techniques are used, a cleaning process may further be utilized to soften any rough edges and to clean any scorched substrate from the respective voids. By way of example and not limitation, exemplary cleaning processes may include TetraMethyl Ammonium Hydroxide (TMAH) or Propylene Glycol TMAH as the etching agent. Such substrate post-process cleaning processes are contemplated and the specific application of these processes is known by those of ordinary skill in the art and is not further described herein.

Figure 16C:
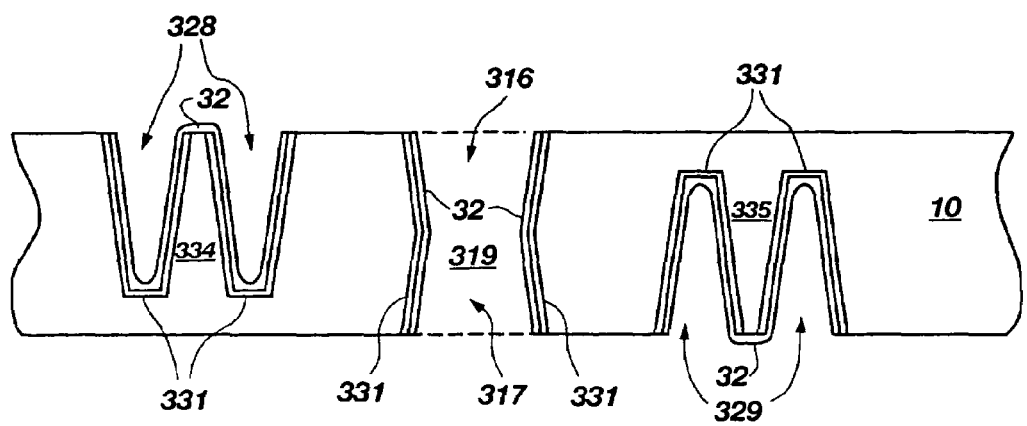

As illustrated in FIG. 16C, if substrate 10 is comprised of a semiconductive or conductive material, an insulative layer 331, such as an oxide layer, is formed on the sidewalls of voids 328, 329 and via voids 316, 317. When substrate 10 is comprised of a nonconductive material, then an insulative layer is unnecessary. In one embodiment, the emerging contact pins 334 and 335 in addition to the surfaces of voids 328, 329 and via voids 316, 317 are conductively coated by depositing a conductive material 32 generally over the emerging contact pins 334 and 335 and throughout the voids 328, 329. Conductive material 32 is further deposited about via voids 316, 317 forming a conductive via 319. In one particular embodiment, conductive material 32 is formed through a metallic plating process that results in conductive surfaces.

Figure 16D:
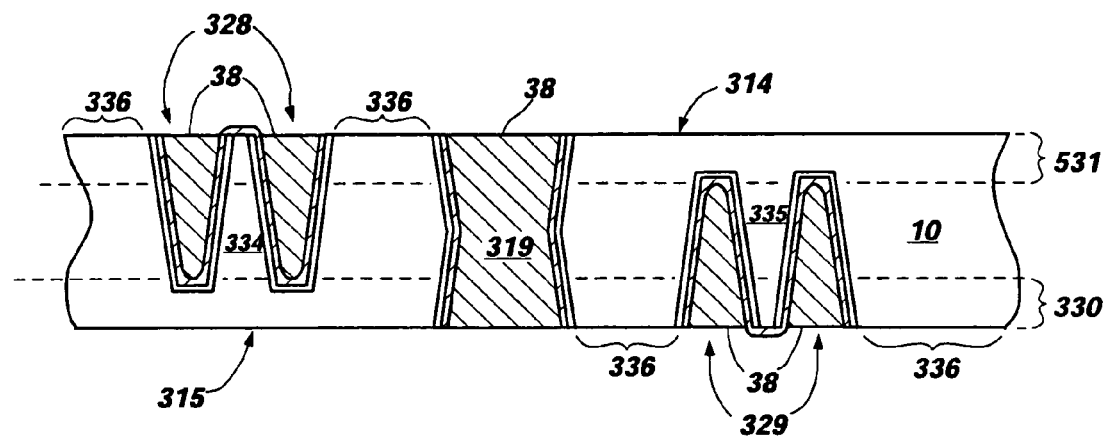

As illustrated in FIG. 16D, a compliant coupling structure couples emerging contact pins 334 and 335 with surrounding remaining portions 336 of substrate 10. By way of example and not limitation, one such structure is compliant coupling material 38. Compliant coupling material 38 at least partially fills voids 328 and 329 and forms a resilient compliant interface between emerging contact pins 334 and 335 with remaining substrate portions 336 of substrate 10. Suitable compliant coupling materials were described above with reference to FIG. 1G. In another embodiment, conductive via 319 may be further filled with compliant coupling material 38 in lieu of voids 328, 329 being filled.

Figure 16E:
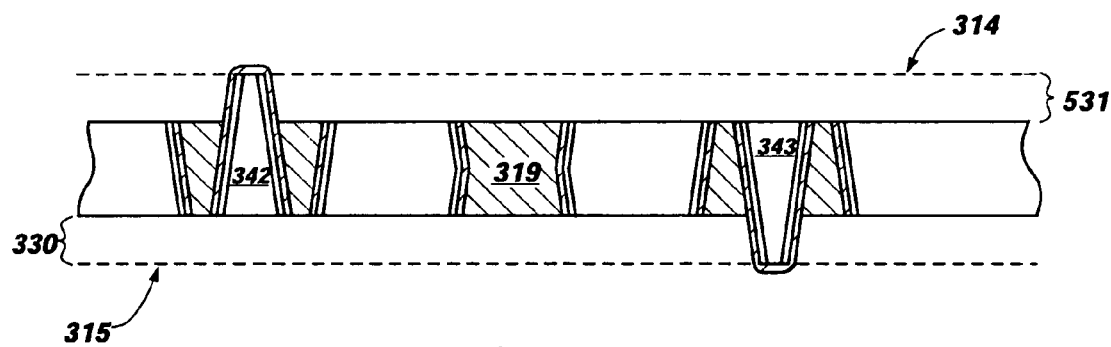

To enable compliant movement relative to the remaining substrate portions 336, the contact pins are released from the remaining substrate portions 336 by second side 315 by at least a distance 330 to release emerging contact pin 334 and correspondingly first side 314 by at least a distance 531 to release emerging contact pin 335. In FIG. 16E, the surface of first side 314 is masked and the surface of second side 315 of substrate 10 is thinned either through an etching process for at least a thickness or distance 330 to release or free contact pin 342 from adjacent portions of substrate 10. Similarly, the surface of second side 315 is masked and the surface of first side 314 of substrate 10 is thinned for at least a thickness or distance 531 to release or free contact pin 343 from adjacent portions of substrate 10. As illustrated, contact pins 342 and 343 are formed from a portion of substrate 10 and remain positioned at original region or location 312 (FIG. 16A) through compliant coupling means, namely compliant coupling material 38.

Figure 16F:
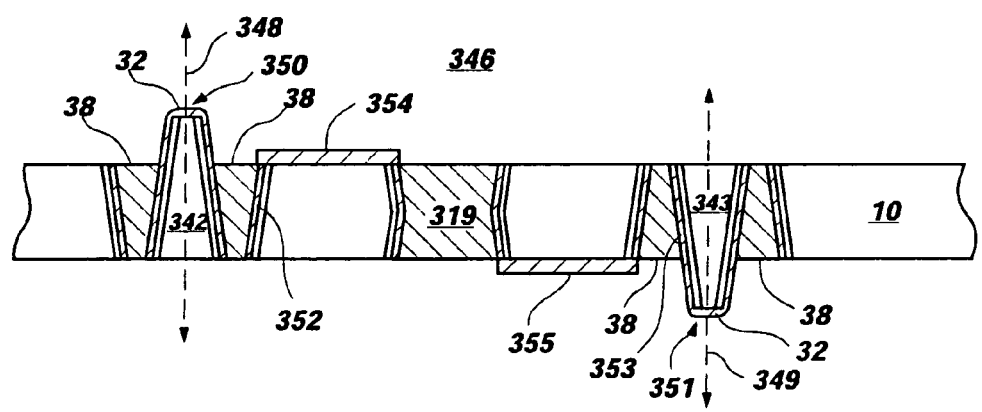

FIG. 16F illustrates a contact pin assembly 346, in accordance with one embodiment of the present invention. Compliant axis 348 relative to contact pin 342 and compliant axis 349 relative to contact pin 343 illustrate the axis of motion of contact pins 342, 343, as a result of the resilient or elastic nature of compliant coupling material 38. Furthermore, in one exemplary embodiment, the compliant coupling material is electrically conductive and is illustrated as compliant coupling material 38. Electrical continuity exists from contact tip or contact end 350 of contact pin 342 to substrate 10 by way of conductive material 32 electrically coupled with electrically conductive compliant coupling material 38, which further is electrically coupled to a portion 352 of the conductive material affixed to the remaining substrate 10. Routing of an electrical signal detected at contact end 350 of contact pin 342 may be further routed via one or more conductive traces 354 to conductive via 319. Similarly, electrical continuity exists from contact tip or contact end 351 of contact pin 343 to substrate 10 by way of conductive material 32 electrically coupled with electrically conductive compliant coupling material 38, which further is electrically coupled to a portion 353 of the conductive material affixed to the remaining substrate 10. Routing of a signal detected at contact end 351 of contact 343 may be further routed via one or more conductive traces 355 to conductive via 319. Conductive traces 354, 355 may be formed according to various interconnection techniques including masking, deposition, and etching techniques, the specifics of which are well known to those of ordinary skill in the art.

Figure 17:
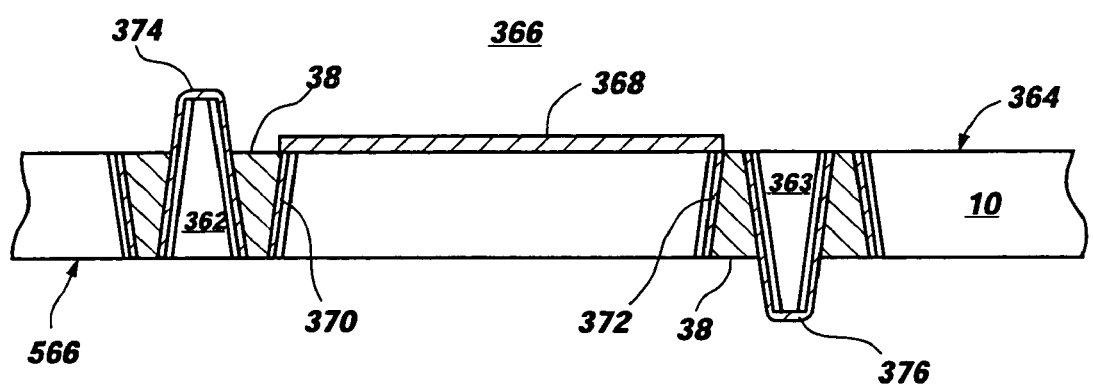
FIG. 17 shows a cross-sectional view of a double-sided compliant contact pin assembly, in accordance with a yet further embodiment of the present invention.

FIG. 17 illustrates a contact pin assembly 366, in accordance with another embodiment of the present invention.

Contact pins 362, 363 may be formed according to the processes described with respect to FIGS. 16A-16E. In the present embodiment, electrical continuity between contact pins 362, 363 is formed by a conductive trace on one or more sides 364, 566. By way of example, FIG. 17 illustrates a conductive trace 368 formed on a first side 364 and coupled between a portion 370 of the conductive material affixed to the remaining substrate 10 of contact pin 362 and a portion 372 of the conductive material affixed to the remaining substrate 10 of contact pin 363. The present embodiment further includes electrically conductive compliant coupling material 38 for providing electrical continuity between contact end 374 of contact pin 362 and portion 370 of the conductive material affixed to the remaining substrate 10. Similarly, contact end 376 of contact pin 363 is electrically coupled to portion 372 by electrically conductive compliant coupling material 38.

Figure 18:
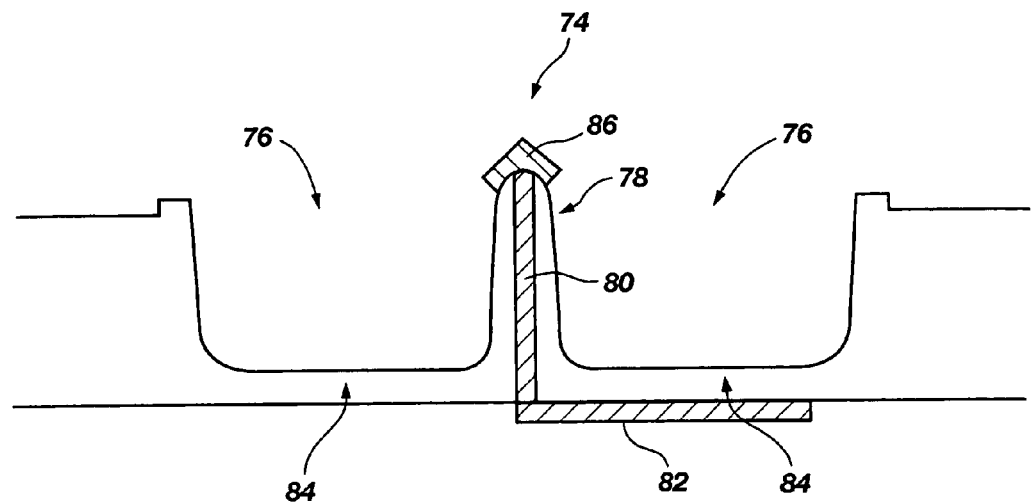
FIG. 18 shows a cross-sectional view of a compliant contact pin assembly, in accordance with a further embodiment of the present invention.
Figure 19:
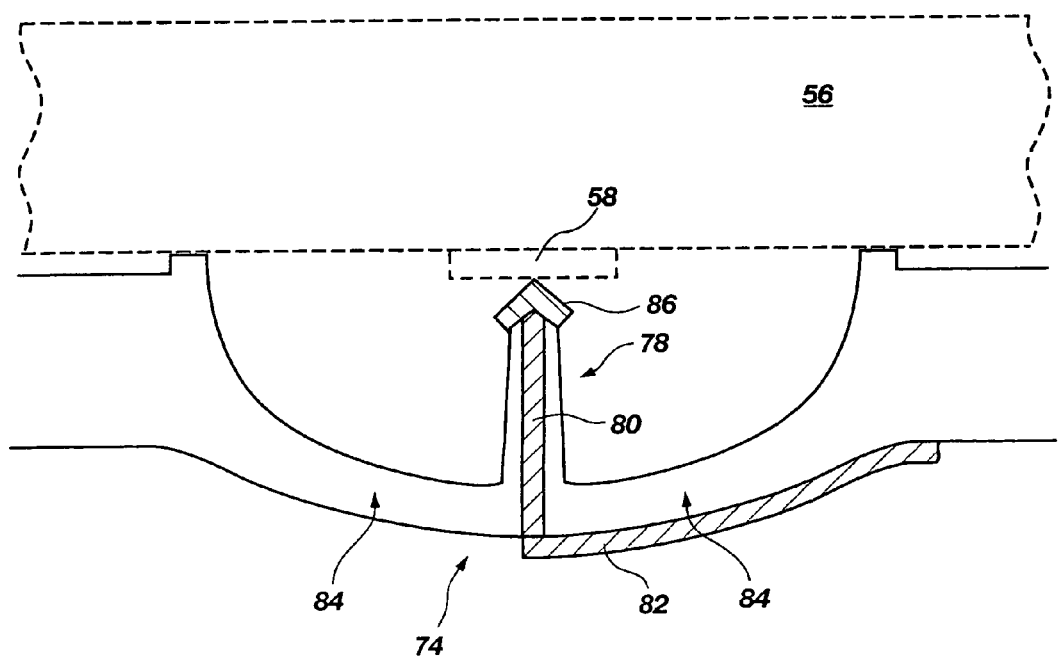
FIG. 19 is a cross-sectional view of a compliant contact pin assembly in a compliant state, in accordance with an embodiment of the present invention.

FIG. 18 illustrates a contact pin assembly 74, in accordance with another embodiment of the present invention. The processing steps for the formation of contact pin assembly 74 occur according to the processing steps of FIGS. 6A-6B to form voids 76 around contact pin 78 with the center bore being filled with a conductive material 80 coupled to an electrical trace 82. According to the present embodiment, a compliant coupling structure provides the compliant action for contact pin 78. In the present embodiment, the compliant coupling structure, by way of example and not limitation, is implemented as a thinned substrate web 84 that is thinned according to the corresponding widths of voids 76. The thinning process enables contact pin 78 to flex, as illustrated in FIG. 19, when a device-under-test 56 having a contact pad 58 is coupled therewith. Additionally, according to FIG. 18, various contact ends or tips 86 may be formed according to deposition, plating, or other processes known by those of ordinary skill in the art.

Figure 20:
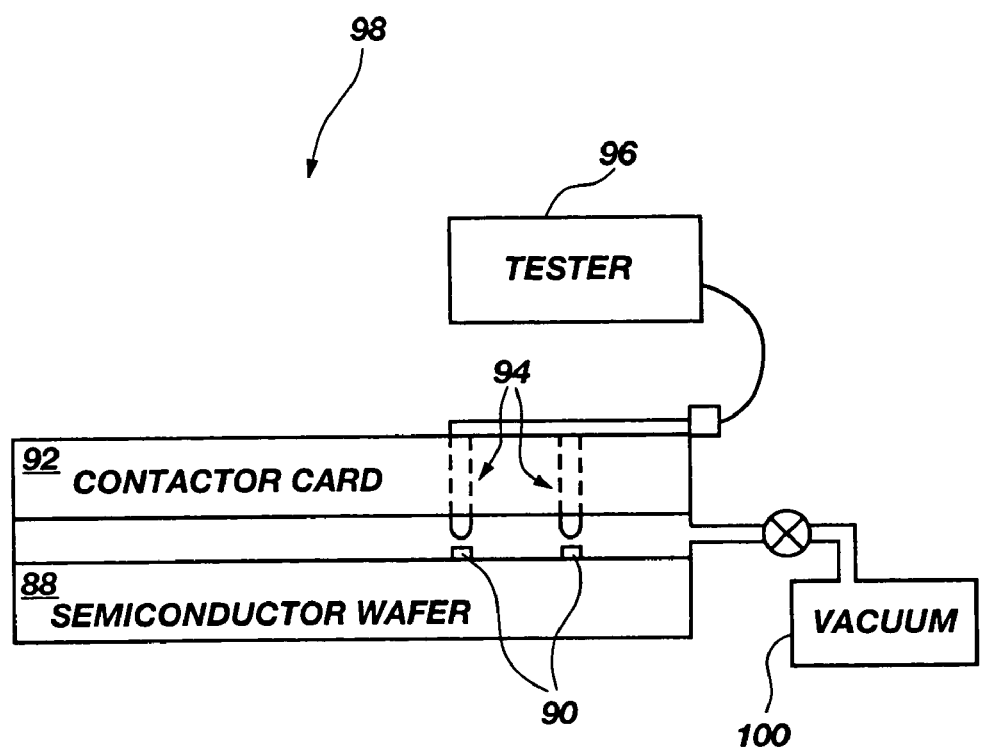
FIG. 20 is a block diagram of a testing system, in accordance with an embodiment of the present invention.

FIG. 20 illustrates a testing system utilizing one or more embodiments of the contact pin assemblies described above. A device-under-test such as a semiconductor wafer 88 having one or more contact pads 90 thereon is coupled with a contactor card 92, which includes one or more contact pin assemblies 94. The contact pin assemblies 94 are further coupled with a tester 96 to form a test system 98. Contactor card 92 on semiconductor wafer 88 may be physically or mechanically coupled through the application of force, or may be coupled together through the use of air pressure as generated by a vacuum 100.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others of ordinary skill in this art to best utilize the invention and various embodiments with various modifications. It is intended that the scope of the invention be identified by the claims appended hereto and their equivalents.

What is claimed is:

1. A contact pin assembly, comprising:
   a substantially planar substrate;
   a first contact pin having a contact end on a contact end side of the substrate and formed from a first portion of the substrate;
   a first compliant coupling structure to moveably couple the first contact pin within the substrate in an orthogonally compliant orientation with the substantially planar substrate; and
   a wire bond extending between the first contact pin and the substrate.

2. The contact pin assembly of claim 1, wherein the first contact pin further comprises conductive material around at least a portion of the first contact pin.

3. The contact pin assembly of claim 2, wherein the wire bond extends from the conductive material of the first contact pin to the substrate.

4. The contact pin assembly of claim 1, wherein the first compliant coupling structure is an elastomer material.

5. The contact pin assembly of claim 1, wherein the first contact pin further comprises a first conductor formed therein from the contact end to an interconnect end of the first contact pin.

6. The contact pin assembly of claim 5, wherein the wire bond extends from the interconnect end of the first conductor to the substrate.

7. The contact pin assembly of claim 1, wherein the substrate is thinner than a length of the first contact pin.

8. The contact pin assembly of claim 1, wherein the substrate is a semiconductor wafer.

9. The contact pin assembly of claim 1, further comprising at least one stop formed on the substrate and configured to establish a maximum range of motion of the first contact pin.

10. The contact pin assembly of claim 1, wherein the contact end of the first contact pin further comprises a profile configured to facilitate electrical coupling of the first contact pin with a contact pad of a device-under-test.

11. A contactor card, comprising:
    a substrate configured for attachment with a semiconductor tester; and
    at least one contact pin assembly, including:
       a substantially planar substrate;
       a first contact pin formed from a first portion of the substrate;
       a first compliant coupling structure to moveably couple the first contact pin within the substrate in an orthogonally compliant orientation with the substrate; and
       a wire bond extending between the first contact pin and the substrate.

12. The contactor card of claim 11, wherein the contact pin further comprises conductive plating around at least a portion of the first contact pin.

13. The contactor card of claim 12, wherein the wire bond extends between the conductive plating of the first contact pin and the substrate.

14. The contactor card of claim 11, wherein the first compliant coupling structure is an elastomer material.

15. The contactor card of claim 11, wherein the first contact pin further comprises a first conductor from a contact end to an interconnect end of the first contact pin.

16. The contactor card of claim 15, wherein the wire bond extends between the interconnect end of the first conductor to the substrate.

17. The contactor card of claim 11, wherein a contact end of the first contact pin further comprises a profile configured to facilitate electrical coupling of the first contact pin with a contact pad of a device-under-test.

* * * * *